(12) United States Patent
Ratliff et al.

(10) Patent No.: US 6,462,310 B1
(45) Date of Patent: *Oct. 8, 2002

(54) HOT WALL RAPID THERMAL PROCESSOR

(75) Inventors: Christopher T. Ratliff, Felton; Jeffrey M. Kowalski, Capitola, both of CA (US); Taiqing Qiu, Newton, MA (US)

(73) Assignee: ASML US, INC, Scotts Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/638,113

(22) Filed: Aug. 11, 2000

Related U.S. Application Data

(63) Continuation-in-part of application No. 09/373,894, filed on Aug. 12, 1999
(60) Provisional application No. 60/096,283, filed on Aug. 12, 1998, and provisional application No. 60/217,321, filed on Jul. 7, 2000.

(51) Int. Cl.⁷ .................................................. F27B 5/14
(52) U.S. Cl. ........................ 219/390; 219/405; 219/411; 118/724; 118/725; 118/50.1; 392/416
(58) Field of Search ................................ 219/390, 405, 219/411; 118/724, 725, 50.1; 392/416, 418

(56) References Cited

U.S. PATENT DOCUMENTS

| | | | |
|---|---|---|---|
| 4,857,689 | 8/1989 | Lee | 219/10.71 |
| 4,962,726 | 10/1990 | Matsuhita et al. | 118/719 |
| 4,976,996 | * 12/1990 | Monkowski et al. | 427/255.5 |
| 5,155,336 | 10/1992 | Gronet et al. | 219/411 |
| 5,252,807 | * 10/1993 | Chizinsky | 219/390 |
| 5,372,648 | * 12/1994 | Yamamoto et al. | 118/723 |
| 5,407,485 | 4/1995 | Takagi | 118/724 |
| 5,444,217 | 8/1995 | Moore et al. | 219/405 |
| 5,520,742 | * 5/1996 | Ohkase | 118/724 |
| 5,683,518 | 11/1997 | Moore et al. | 118/730 |
| 5,755,511 | 5/1998 | Peuse et al. | 374/128 |
| 5,763,856 | * 6/1998 | Ohkase | 219/390 |
| 5,781,693 | 7/1998 | Ballance et al. | 392/416 |
| 5,830,277 | 11/1998 | Johnsgard et al. | 118/725 |
| 5,848,842 | 12/1998 | Peuse et al. | 374/1 |
| 5,862,302 | 1/1999 | Okase | 392/416 |
| 5,863,843 | 1/1999 | Green et al. | 438/771 |
| 5,974,682 | * 11/1999 | Akimoto | 34/66 |
| 6,056,544 | * 5/2000 | Cho | 432/249 |
| 6,086,677 | * 7/2000 | Umotoy et al. | 118/715 |

* cited by examiner

*Primary Examiner*—Teresa Walberg
*Assistant Examiner*—Shawntina T. Fuqua
(74) *Attorney, Agent, or Firm*—Dorsey & Whitney LLP

(57) ABSTRACT

An apparatus for heat treatment of a wafer is disclosed. The apparatus includes a heating chamber having a heat source. A cooling chamber is positioned adjacent to the heating chamber and includes a cooling source. A wafer holder is configured to move between the cooling chamber and the heating chamber through a passageway and one or more shutters defines the size of the passageway. The one or more shutters are movable between an open position where the wafer holder can pass through the passageway and an obstructing position which defines a passageway which is smaller than the passageway defined when the shutter is in the open position.

46 Claims, 30 Drawing Sheets

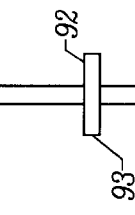
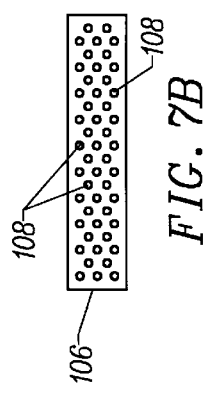
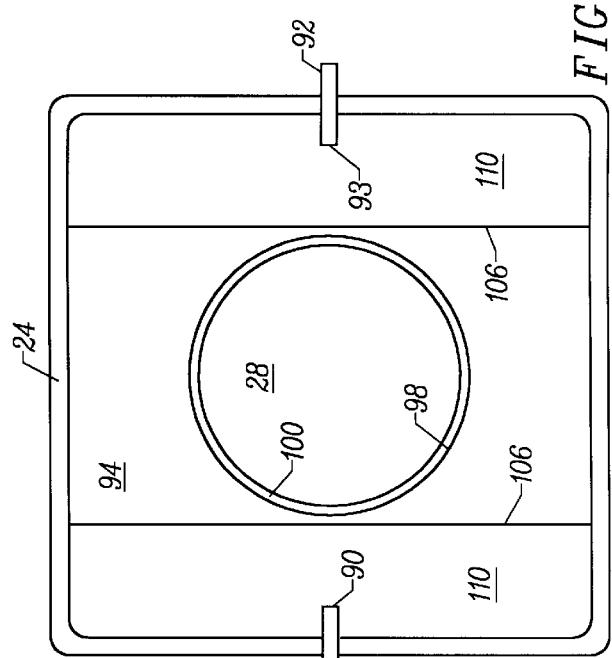
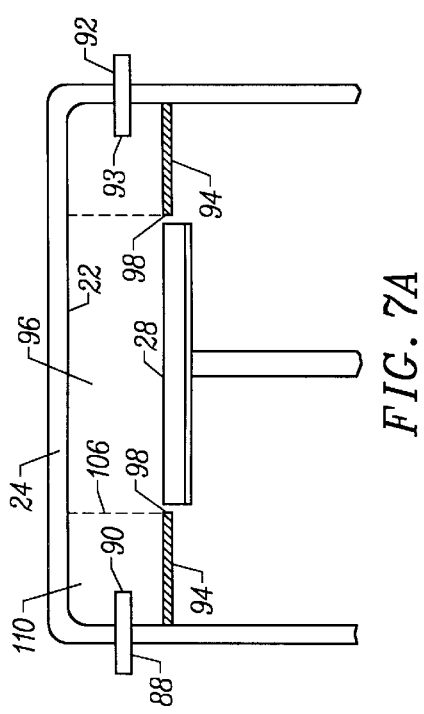
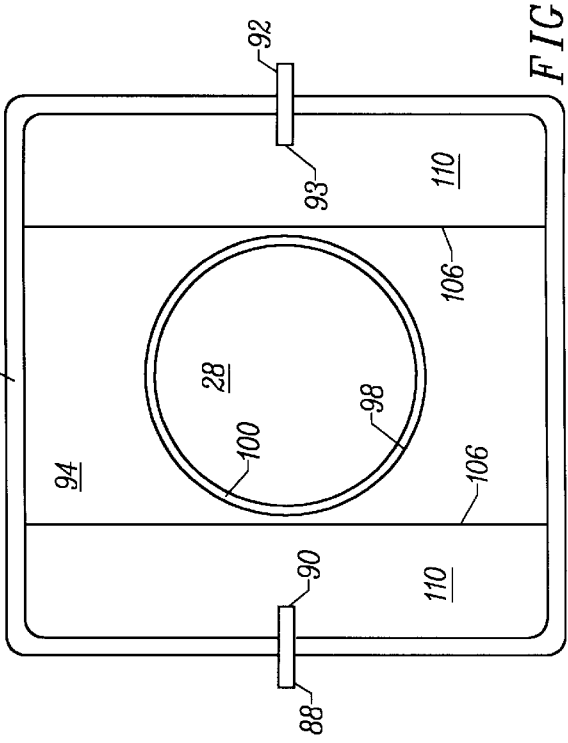

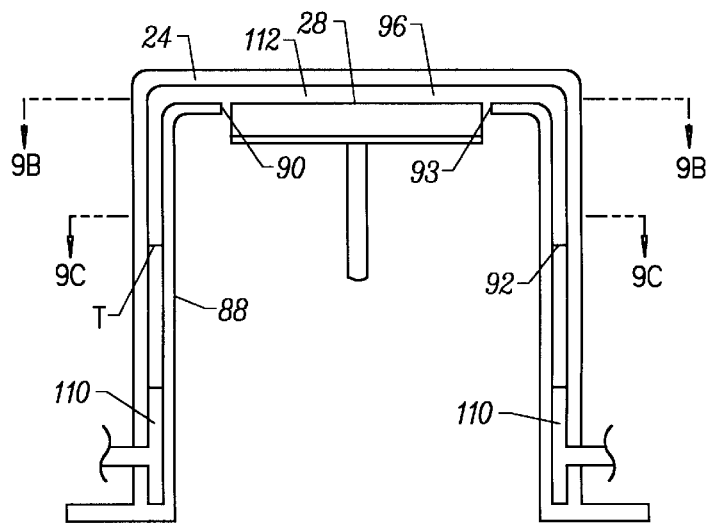
FIG. 9A
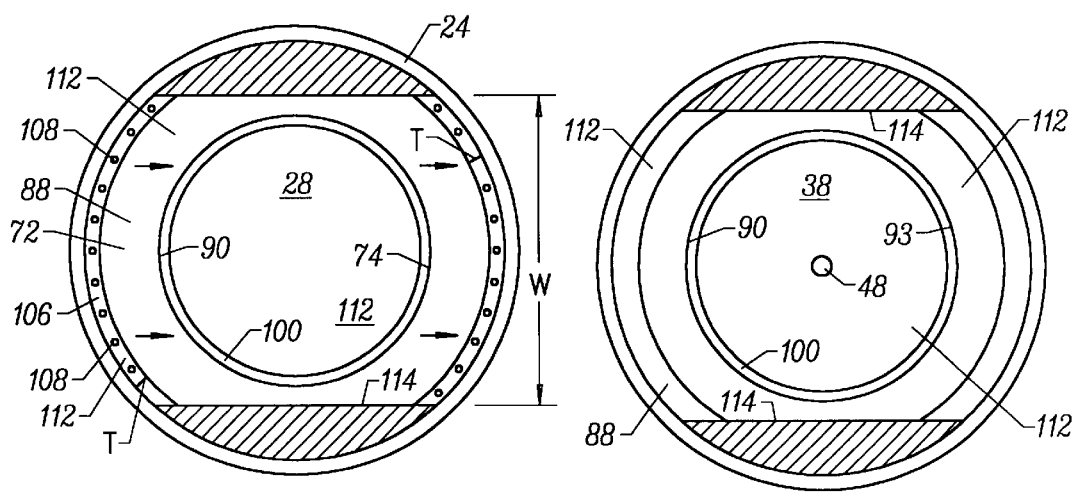
FIG. 9B
FIG. 9C

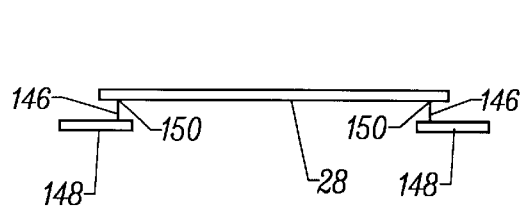
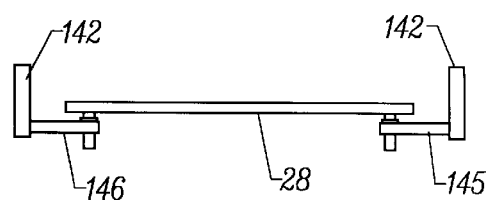
FIG. 16B          FIG. 16A
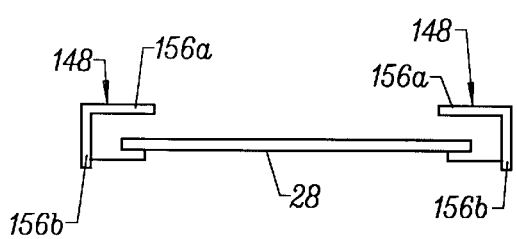
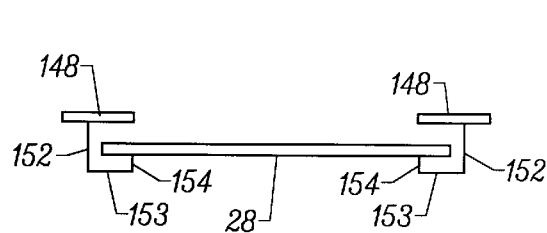
FIG. 16D          FIG. 16C

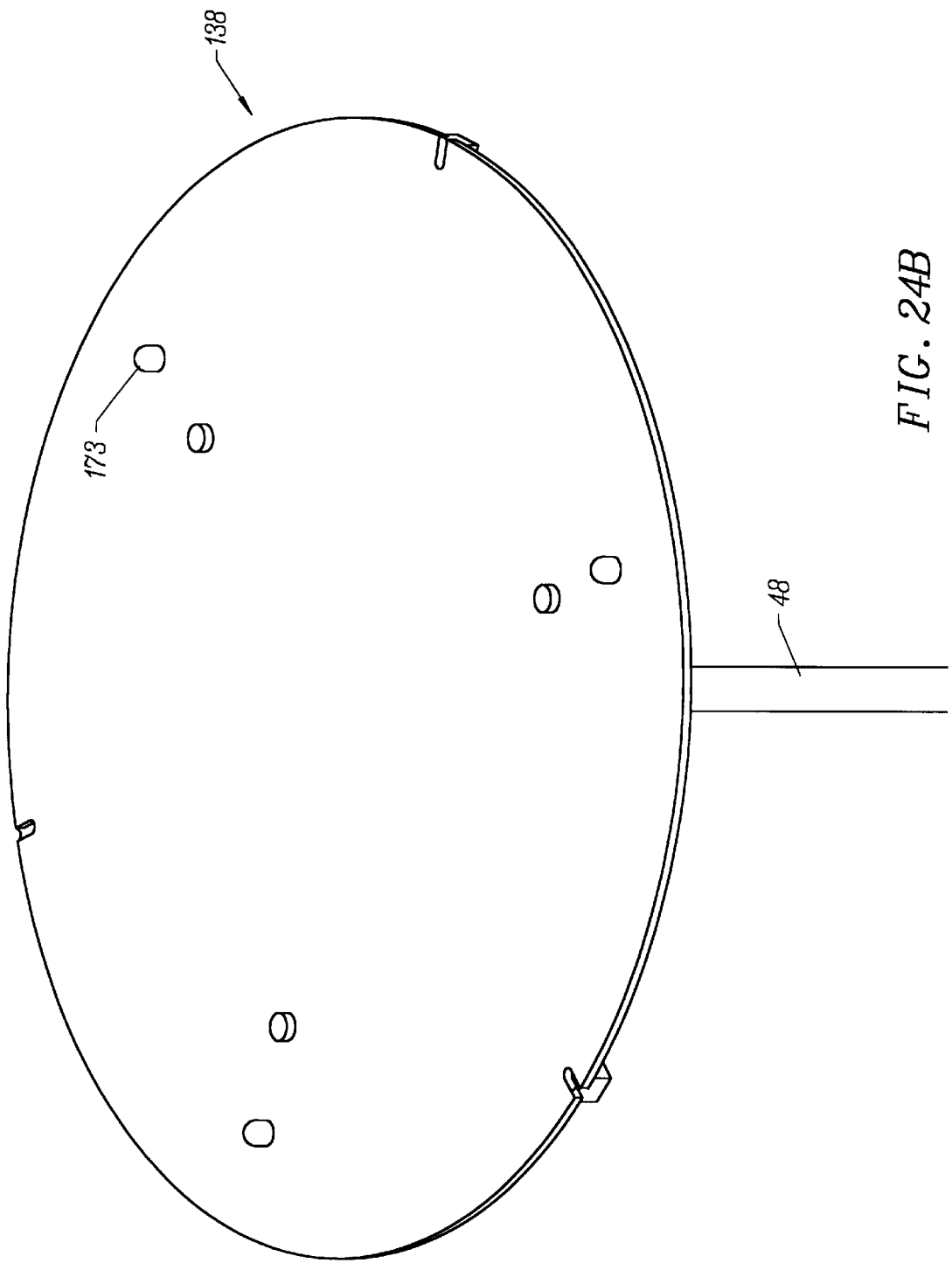

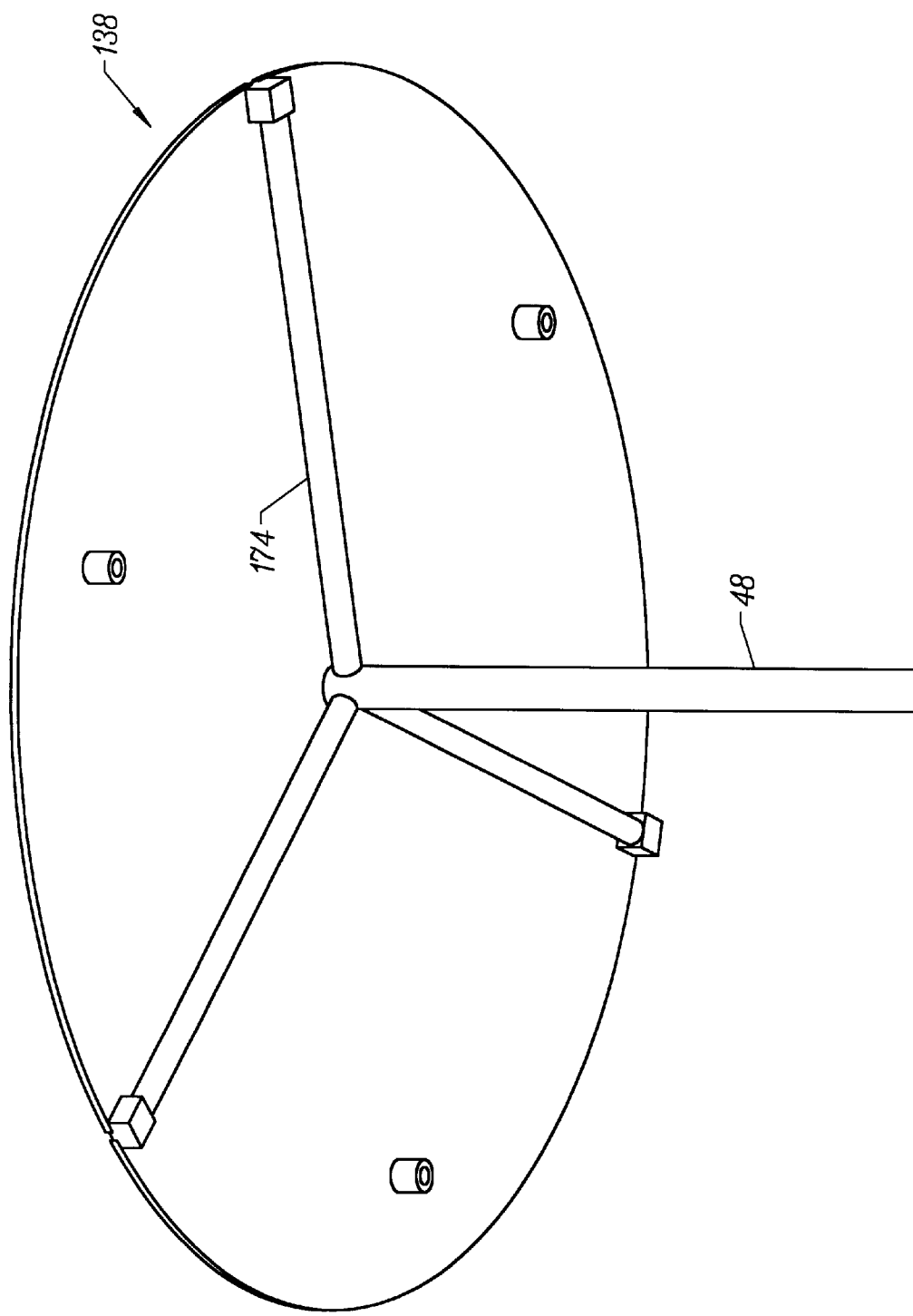

HOT WALL RAPID THERMAL PROCESSOR

RELATIONSHIP TO CO-PENDING APPLICATIONS

This application is a continuation-in-part of U.S. application Ser. No. 09/373,894 filed on Aug. 12, 1999 entitled "Hot Wall Rapid Thermal Processor" which claims priority to U.S. Provisional Patent Application Serial No. 60/096,283 filed on Aug. 12, 1998 entitled "Linear RTP Reactor," and U.S. Provisional Patent Application Serial No. 60/217,321 filed on Jul. 7, 2000 entitled "Hot Wall Rapid Thermal Processor", the entire disclosures of all are hereby incorporated by reference herein.

FIELD OF THE INVENTION

The present invention relates to an apparatus for providing heat to wafers and more particularly to an apparatus for rapid thermal processing of wafers.

BACKGROUND OF THE INVENTION

Heat treatment apparatuses are used in a variety of industries including the manufacture of semiconductor devices. These heat treatment apparatuses can be used for several different fabrication processes such as thermal annealing, thermal cleaning, thermal chemical vapor deposition, thermal oxidation and thermal nitridation. These treatments often require that the temperature of a wafer be elevated to as high as 350° C.–1300° C. before and during the treatment. Further, these treatments often require that one or more fluids be delivered to the wafer.

There are several design challenges to meeting the thermal requirements of heat treatment apparatuses. For instance, it is often desirable to quickly ramp up and/or down the temperature of a wafer to be treated. During these rapid temperature changes the temperature uniformity of the wafer should be sufficient to prevent damage to the wafer. Wafers often cannot tolerate even small temperature differentials during high temperature processing. For instance, a temperature difference above 1°–2° C./cm at 1200° C. can cause enough stress to produce slip in the silicon crystal of certain wafers. The resulting slip planes will destroy any devices through which they pass.

Delivery of fluid to the wafer can also present design challenges. For instance, the exposure of the wafer to the fluid should be uniform across the wafer to avoid uneven treatment results. Further, fluids within the heat treatment apparatus must often be rapidly evacuated from the heat treatment apparatus. Another challenge derived from fluid delivery is the replacement of fluids within the heating chamber with other fluids. This exchange of fluids must often occur with minimal interaction between the original and replacement fluids.

SUMMARY OF THE INVENTION

The invention relates to a heat treatment apparatus. The apparatus includes a heating chamber having a heat source. A cooling chamber is positioned adjacent to the heating chamber and includes a cooling source. A wafer holder is configured to move between the cooling chamber and the heating chamber through a passageway. One or more shutters defines the size of the passageway and are movable between an open position where the wafer holder can pass through the passageway and an obstructing position which defines a passageway which is smaller than the passageway defined when the shutter is in the open position. Of particular advantage, the shutters promote thermal isolation and chemical isolation of the heating chamber and cooling chamber.

Another embodiment of the apparatus includes a heating chamber positioned adjacent to a cooling chamber. A wafer holder is configured to be positioned in the cooling chamber at a loading position where the wafer can be removed from the wafer holder. The wafer holder is movable between the cooling chamber and the heating chamber. A cooling source such as a cooling plate is positioned in the cooling chamber so as to be positioned beneath the wafer holder when the wafer holder is positioned in the loading position.

Another embodiment of the apparatus includes a heating chamber with a closed upper end. A plurality of heating elements are positioned above the closed upper end of the heating chamber. The upper end of the heating chamber includes a heating plate which is configured to receive thermal energy from the heating elements and distribute the thermal energy in a substantially uniform manner over a surface of the heating plate which is positioned within the heating chamber. The heating plate includes a plurality of fluid ports which are configured to be coupled with a fluid source. A wafer holder is configured to be positioned in the heating chamber such that a wafer held by the wafer holder receives fluid delivered into the heating chamber through the fluid ports.

Another embodiment of the apparatus includes a cooling chamber positioned adjacent to a heating chamber. A wafer holder is coupled with at least one shaft which is driven so as to move the wafer holder between the cooling chamber and the heating chamber through a passageway. Two or more shutters are positioned adjacent to the passageway and are movable within a horizontal plane so as to define the size of the passageway. The two or more shutters are movable to an obstructing position where the two or more shutters encompass the at least one shaft coupled with the wafer holder.

The invention also relates to a heat treatment apparatus having a heating chamber and one or more fluid inlet ports for delivery of a fluid into the heating chamber. A member extends into the heating chamber from a side of the heating chamber at a height below a height of the fluid inlet port. The member has an edge with a shape which is complementary to the perimeter of a portion of the wafer to be treated in the apparatus. A wafer holder is movable within the heating chamber and can move the wafer adjacent to the member to define a fluid flow region within the heating chamber.

Another embodiment of a heat treatment apparatus having a heating chamber and one or more fluid inlet ports for delivery of a fluid into the heating chamber includes a flow distribution chamber which distributes a flow of fluid from the one or more fluid inlet ports. The flow distribution chamber is positioned such that fluid from the fluid inlet port enters the heating chamber through the flow distribution chamber.

The apparatus can also include a fluid exhaust port for withdrawing fluid from the heating chamber and a second flow distribution chamber for distributing a flow of fluid from the heating chamber to the fluid exhaust port. The second flow distribution chamber is positioned such that fluid from the heating chamber enters the fluid exhaust port through the flow distribution chamber.

A flow distribution chamber associated with a fluid inlet port can include a flow distribution member positioned such that fluid from the fluid inlet port enters the heating chamber through the flow distribution chamber. Similarly, a flow distribution chamber associated with a fluid exhaust port can include a flow distribution member positioned such that fluid from the heating chamber enters the fluid exhaust port through the flow distribution chamber.

The invention also relates to a method for rapid thermal processing of a wafer. The method includes providing a heating chamber having a heating plate and heating the heating plate. The method also includes positioning a wafer in a wafer holder and moving the wafer holder toward the heating plate until the wafer is positioned close enough to the heat source for heat to be conducted from the heating plate to the wafer.

The method can also include backing the wafer holder away from the heating plate after a target condition has been achieved at the wafer and delivering a fluid into the heating chamber from above the wafer holder.

In another aspect, the present invention provides a wafer holder and heat treatment apparatus configured to promote more uniform heating of the wafer.

In yet another aspect, the heating treatment apparatus provides improved containment of the gases within the heating chamber by establishing a pressure differential between the heating and cooling chambers and flowing a purge gas.

BRIEF DESCRIPTION OF THE FIGURES

FIG. 7A illustrates a fluid delivery system with a flow distribution chamber positioned adjacent to a fluid flow region.

FIG. 7B is a side view of a flow distribution member for use in a flow distribution chamber.

FIG. 7C illustrates a fluid delivery system having an arc shaped flow distribution member.

FIG. 7E illustrates a fluid delivery system having a flat flow distribution member in a rectangular processing tube.

FIGS. 9A–9D illustrate a fluid delivery system having a fluid flow passage defined by a portion of an inlet port, a fluid flow region and a portion of the fluid exhaust region.

FIGS. 16A to 16D are cross sectional views of the wafer holder according to four alternative embodiments of the present invention.

FIGS. 24A to 24C are cross-sectional, top perspective and bottom perspective views, respectively, of another embodiment of the wafer carrier of the present invention.

DETAILED DESCRIPTION

Figure 1A:
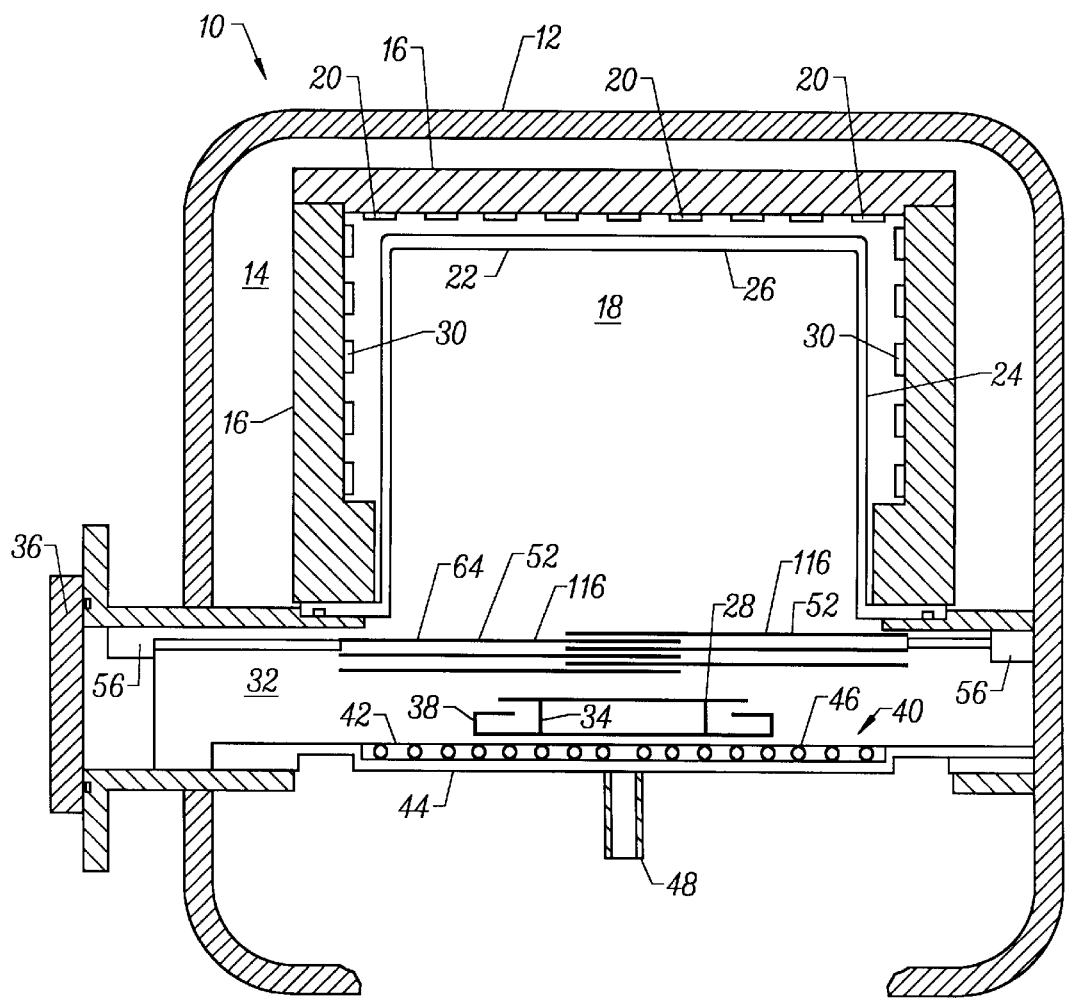
FIG. 1A is a cross section of a heat treatment apparatus having a heating chamber adjacent to a cooling chamber.

The present invention relates to a heat treatment apparatus. The heat treatment apparatus includes a heating chamber with a heating source positioned adjacent to a cooling chamber with a cooling source. The apparatus also includes a wafer holder configured to be moved between the heating chamber and the cooling chamber through a passageway. A shutter is positioned to control the size of the passageway. The shutter can be moved between an open position where the passageway is defined large enough for the wafer holder to pass through and a plurality of obstructing positions where a smaller passageway is defined. The shutter can be positioned in the obstructing positions whether the wafer holder is positioned within the cooling chamber or within the heating chamber.

The shutter can be constructed as a thermal insulator. Accordingly, when the shutter is positioned in an obstructing position, the shutter can serve to increase the thermal isolation between the heating chamber and the cooling chamber above the degree of thermal isolation which is achievable without the shutter. The increased thermal isolation also allows for an increased difference between the average temperature within the heating chamber and the average temperature within the cooling chamber. For instance, for a given average temperature in the heating chamber, the cooling chamber can have a lower average temperature than would be possible without the shutter. Reducing the average temperature in the cooling chamber permits an increased temperature ramp down rate when the wafer is positioned within the cooling chamber. Similarly, increasing the average temperature in the heating chamber permits increased temperature ramp up rates when the wafer is within the heating chamber. Increasing the temperature ramp up and ramp down rates allows for quicker wafer treatment rates and accordingly quicker throughput.

The heating source can include a heating plate which receives heat rays from heating elements positioned above the heating plate. The heating plate re-radiates the received heat into the heating chamber from a surface of the heating plate which is positioned within the heating chamber. The heating plate is constructed from a material with a high thermal conductivity so the received heat has a more uniform distribution across the heating plate. Increasing the uniformity of the thermal distribution within the heating plate also increases the uniformity of heat rays radiated into the heating chamber.

During the temperature ramp up of the wafer, the wafer holder can be positioned anywhere within the heating chamber. However, the wafer holder is preferably positioned such that a wafer within the wafer holder is sufficiently close to the heating plate that heat is conducted from the heating plate to the wafer. For instance, the wafer is preferably positioned within two millimeters of the heating plate. This positioning of the wafer relative to the heating plate allows the heat transfer to occur through both conduction and radiation. Since two forms of heat transfer deliver heat to the wafer, the apparatus can increase the temperature ramp up rate above the temperature ramp up rate achieved by apparatuses relying primarily on radiation as the heat transfer mechanism.

The heating plate can define at least a portion of the upper end of the heating chamber and the path from the wafers to the heating plate can be unobstructed. This unobstructed path permits the wafer to be moved in closer proximity to the heating plate. Additionally, the unobstructed path prevents intervening mediums from altering the uniformity of the thermal distribution of heat produced by the heating plate. Further, the unobstructed path also permits more control over the conditions at the surface of the wafer. For instance, changes in the conditions of the heating plate, such as changes in the temperature of the heating plate, are transferred directly to the wafer without being delayed by transfer through some intervening medium.

A relationship between the temperature of the heating plate and the temperature of the wafer surface can be developed for a particular displacement of the wafer from the heating plate. This relationship can be used to control the temperature of the wafer by adjusting the temperature of the heating plate. Since the heating plate has a large thermal mass, it acts as a thermal reservoir with a temperature which is easily monitored and controlled. Since the temperature of the heating plate is easily controlled, the above relationship allows the temperature of the wafer to be more easily controlled than is currently possible. Moreover, the present invention provides improved temperature stability and improved temperature control. For example, the present invention significantly reduces temperature overshoot problems and problems associated with thermal cycling. Also, there is a much lower peak power requirement, and better overall energy efficiency.

A number of improved fluid delivery systems are included in the scope of the present invention. For instance, a plurality of fluid ports can be formed in the upper end of the heating chamber. A fluid can be delivered into the heating chamber through these fluid ports. Because these fluid ports are positioned at the upper end of the heating chamber, the fluid can be delivered onto an upper surface of a wafer in the wafer holder even when the wafer is positioned in close proximity to the upper end of the heating chamber. These fluid ports can be uniformly positioned across the upper end in order to increase the uniformity of the fluid delivery to the wafer. The increased uniformity allows for a plug type flow of liquid from the upper end of the heating chamber toward the wafer. A plug type allows for a more rapid evacuation of fluid from the heating chamber. Further, a plug type flow allows the fluids within the heating chamber to be rapidly exchanged with a reduced level of interaction between the exchanged gasses.

Since the heating plate can be included in the upper end of the heating chamber, the fluid ports can be included in the heating plate. Accordingly, the heating plate can be used for delivery of both heat and fluids to the wafer; however this is just one example and other configurations can be used.

The cooling source within the cooling chamber can include a cooling plate. The cooling plate can be positioned so that an upper surface of the cooling plate is adjacent to a wafer on the wafer holder when the wafer holder occupies one or more loading positions within the cooling chamber. The loading positions are positions which the wafer holder can occupy while wafers are loaded and unloaded from the wafer holder. The cooling plate preferably has a high thermal conductivity so the cooling is distributed through an upper surface of the cooling plate and a high thermal emissivity so the cooling effects are distributed into the cooling chamber. Distribution of the cooling through the cooling plate increases the uniformity of cooling provided to the wafers and accordingly reduces the stress experienced by the wafers during cooling.

The cooling source can also include a cooling fluid conduit for delivering a cooling fluid into the cooling chamber. The cooling fluid conduit can be used in conjunction with a cooling plate or can replace the cooling plate.

FIG. 1A illustrates a cross section of a heat treatment apparatus 10. The apparatus 10 includes a casing 12 which partially encloses a heating section 14 of the apparatus 10. The heating section 14 includes one or more thermal insulators 16 positioned adjacent to a heating chamber 18. A plurality of heating elements 20 are attached to a thermal insulator 16 adjacent to an upper end 22 of the heating chamber 18. Suitable heating elements 20 include, but are not limited to, resistive heating elements coupled with a power source controlled by a computer (not shown).

The heating chamber 18 is partially defined by a processing tube 24. A heating plate 26 defines the upper end 22 of the heating chamber 18. The heating plate 26 has a perimeter which is large enough to cover a wafer 28 positioned adjacent to the heating plate 26. The heating plate 26 can be constructed from the same materials as the rest of the processing tube 24 or can be constructed from different materials. Further, the heating plate 26 can be formed integrally with the remainder of the processing tube 24 or can be attached to the remainder of the processing tube 24. Suitable materials for the processing tube 24 include, but are not limited to, high purity quartz, fused silica and silicon carbide. Further, the heating plate 26 is preferably constructed from materials with a high thermal conductivity such as silicon carbide and graphite covered with silicon carbide.

The heating plate 26 and heating elements 20 serve as an example of a heat source for use with the apparatus 10. The heating plate 26 receives heat rays radiated from the heating elements and radiates secondary heat rays into the heating chamber 18. The heating plate 26 can have a high thermal conductivity so the heat received from the heating elements 20 is distributed through the heating plate 26.

A plurality of secondary heating elements 30 can optionally be coupled with the thermal insulators 16 adjacent to the sides of the processing unit. The secondary heating elements 30 can provide additional heat to the heating chamber 18 and/or can be used to achieve better control over the temperature within the heating chamber 18 and to achieve better temperature uniformity. In one example, the heating elements may be of a resistive type.

The apparatus 10 also includes a cooling chamber 32 positioned adjacent the heating chamber 18. FIG. 1A illustrates a wafer 28 resting on a plurality of wafer support pins 34 extending upward from the bottom of the cooling chamber 32. The cooling chamber 32 can be accessed from a load/lock chamber through a slit valve 36 in order to load and/or unload a wafer 28 from the wafer support pins 34. A robotic arm can be used to load and unload the wafer 28 from the pins. Although a single wafer 28 is illustrated in FIG. 1A, a cartridge holding a plurality of wafers 28 can be supported on the wafer support pins 34. Accordingly, the heat treatment apparatus 10 of the present invention can be used to concurrently treat a plurality of wafers 28.

FIG. 1A also illustrates a wafer holder 38 in a loading position beneath the wafer 28. The loading positions are positions occupied by the wafer holder 38 when a wafer 28 is loaded on and/or off the wafer support pins 34. The wafer holder 38 can have a ring shape, or a plate/disk shape, which encompasses the pins. As will be described in more detail below, the wafer holder 38 is configured to move between the cooling chamber 32 and the heating chamber 18.

A cooling source 40 is positioned within the cooling chamber 32 so as to be beneath the wafer holder 38 when the wafer holder 38 is positioned within the cooling chamber 32. The cooling source 40 is preferably positioned adjacent to the bottom of the cooling chamber 32 and is most preferably positioned beneath the wafer 28 when the wafer holder 38 is in a loading position.

Figure 1B:
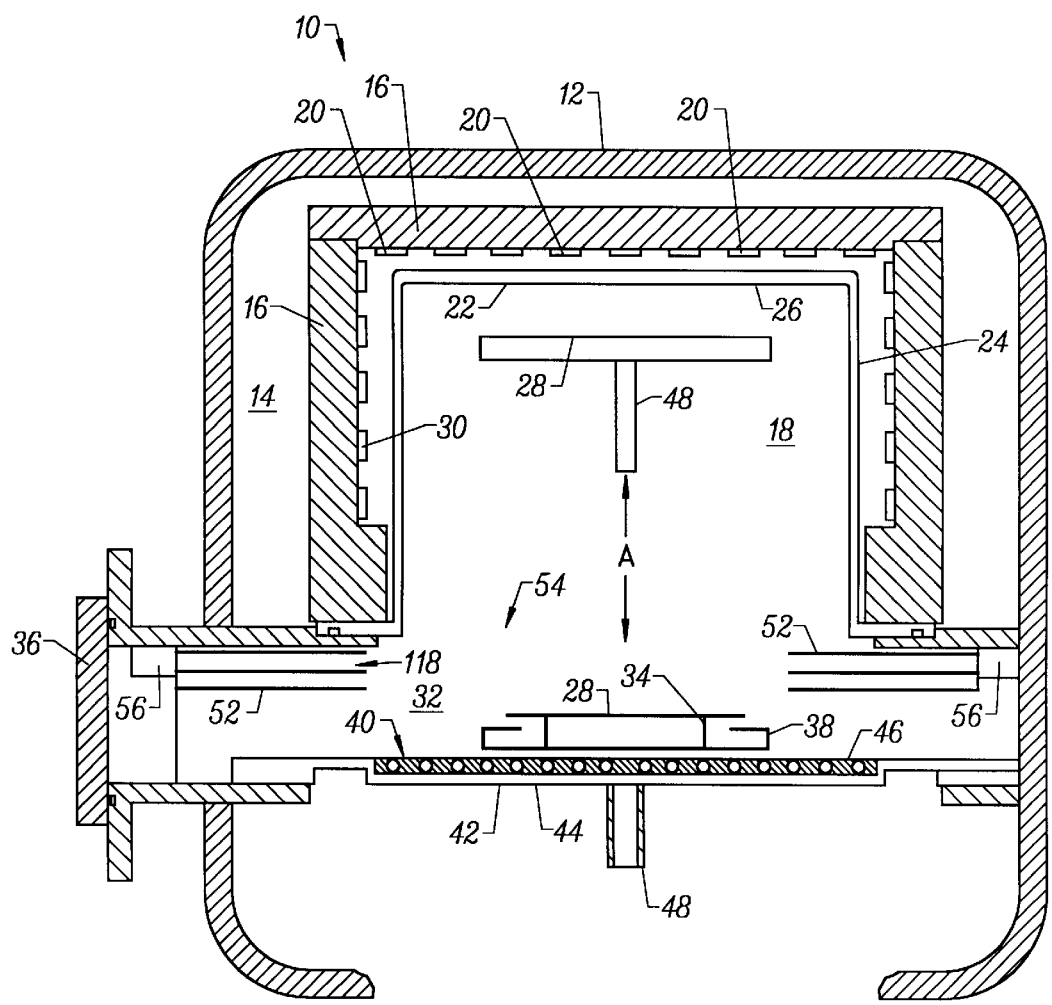
FIG. 1B is a cross section of a heat treatment apparatus having a shutter in an open position.

The cooling source 40 preferably includes a cooling plate 42. The cooling plate 42 can be positioned adjacent to one or more cooling fluid conduits 44 as illustrated in FIG. 1A. Alternatively, a cooling plate 42 can include one or more cooling fluid conduits 44 extending through the cooling plate 42 as illustrated in FIG. 1B. A cooling fluid can be flowed through the cooling fluid conduits 44. The cooling plate 42 serves to distribute the cooling effect of these fluids across the surface of the plate so a wafer 28 being held by the wafer holder 38 sees a more uniform cooling effect. Suitable cooling fluids for use with the cooling fluid conduits 44 include, but are not limited to, chilled water and liquid nitrogen. Suitable materials for the cooling plate 42 include, but are not limited to, materials with a high thermal conductivity and/or a high thermal emissivity such as silicon carbide, aluminum, stainless steel, copper coated with silicon nitride and aluminum nitride.

When the cooling source 40 is a cooling plate 42, the cooling plate 42 preferably has a solid upper surface 46 which is substantially parallel to the plane of the wafer 28 in order to provide substantially uniform cooling to the wafer 28. However, the cooling plate 42 can include a plurality of apertures which are large enough to accommodate the wafer support pins 34 or the wafer support pins 34 can be mounted directly to the upper surface 46 of the cooling plate 42.

The upper surface 46 of the cooling plate 42 preferably has a perimeter which is larger than the perimeter of the wafer 28. Further, the cooling plate 42 is preferably positioned to be approximately concentric with wafers 28 positioned on the wafer support pins 34 or with wafers 28 being held by the wafer holder 38. For instance, the cooling plate 42 preferably has a round shape with a larger diameter than the wafer 28. The round shape of the cooling plate 42 is then positioned such that the center of the cooling plate 42 is positioned approximately beneath the center of the wafer 28. This concentric positioning combined with the increased diameter of the cooling plate 42 relative to the wafer 28 causes the perimeter of the cooling plate 42 to extend beyond the perimeter of the wafer 28.

The wafer holder 38 is coupled with a shaft 48. The shaft 48 can be coupled with an elevator mechanism (not shown) which can provide the shaft 48 with an upward and downward motion. The upward motion of the shaft 48 elevates the wafer holder 38 as illustrated in FIG. 1B. When the wafer holder 38 is in a load position as illustrated in FIG. 1A, elevation of the wafer holder 38 lifts the wafer 28 from the wafer support pins 34 and can move the wafer holder 38 from the cooling chamber 32 to the heating chamber 18. The shaft 48 can also be moved downward to move the wafer holder 38 from the heating chamber 18 to the cooling chamber 32 and to replace the wafer 28 upon the wafer support pins 34. Although the wafer holder 38 is illustrated as coupled with a single shaft 48, the wafer holder 38 can be coupled with a plurality of shafts 48 including, but not limited to, two, three and four shafts 48. Further, when the apparatus 10 includes a cooling plate 42, the cooling plate 42 can include apertures configured to accommodate each of the shafts 48 coupled with the wafer holder 38.

As illustrated in FIG. 1B, the apparatus 10 includes shutters 52 which define the size of a passageway 54 between the cooling chamber 32 and the heating chamber 18. The shutters 52 illustrated in FIG. 1B are positioned in an open position where the shutters 52 define a passageway 54 which is sufficiently large for the wafer holder 38 to pass between the heating chamber 18 and the cooling chamber 32.

Figure 1C:
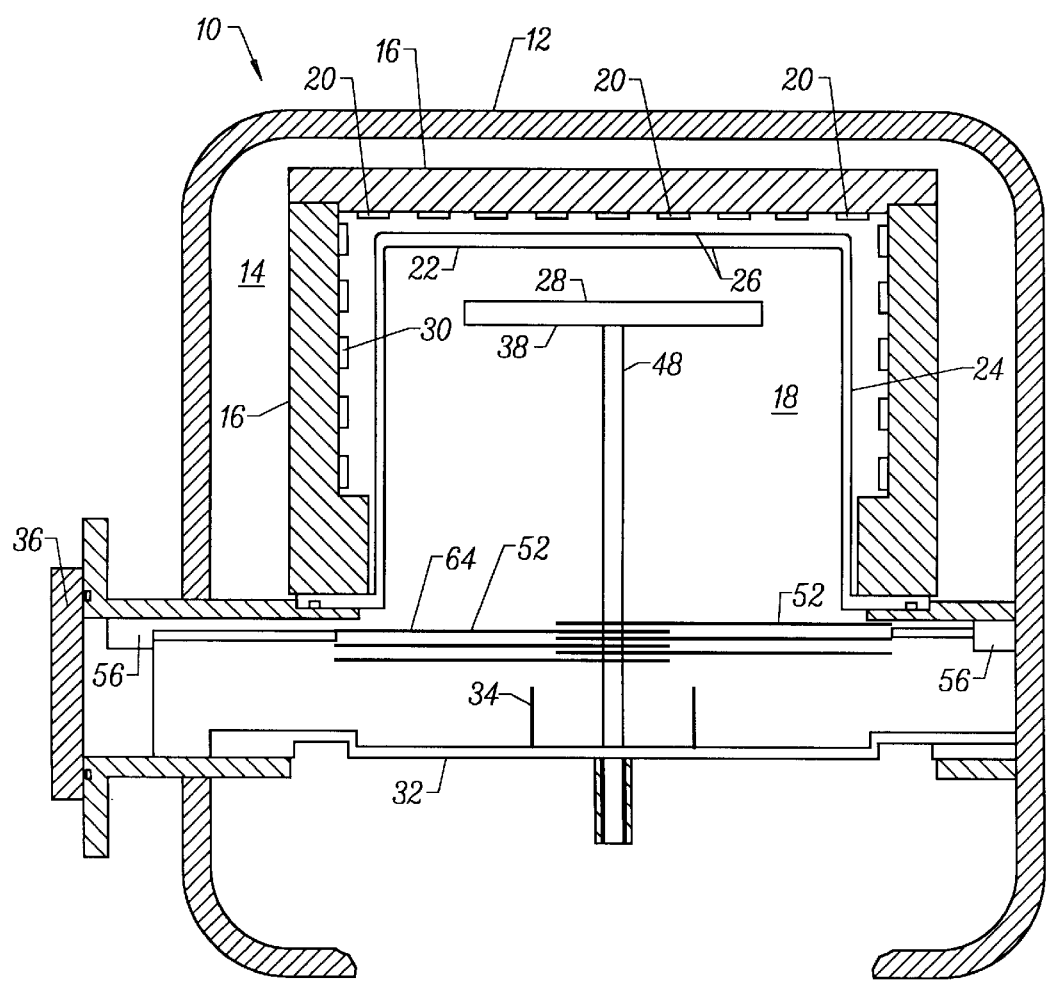
FIG. 1C is a cross section of a heat treatment apparatus having a shutter in an obstructing position.

The shutters 52 can be coupled with motors 56 which serve to move the shutters 52 in a horizontal plane as illustrated by the arrow labeled B. Accordingly, the shutters 52 can be moved to an obstructing position where the shutters 52 define a passageway 54 which is smaller than the size of the passageway 54 defined when the shutters 52 are in the open position. For instance, FIG. 1C illustrates the shutters in an obstructing position where the size of the passageway 54 approximates the size of the shaft 48 coupled with the wafer holder 38. Accordingly, the shutter 52 can be in an obstructing position while the wafer holder 38 is positioned within the heating chamber 18. The configuration illustrated in FIG. 1C is the preferred configuration for the apparatus 10 during the treatment of the wafer 28.

Treatment of the wafer 28 can include delivering a fluid, a gas or vapor to the wafer 28 in the heating chamber 18. The obstructing position of the shutter 52 illustrated in FIG. 1C can also serve to reduce and even prevent entry of the fluids from the heating chamber 18 into the cooling chamber 32. Accordingly, the shutters 52 can prevent these fluids from fouling mechanisms in the cooling chamber 32 or in an associated load/lock chamber.

The shutter 52 can also be constructed to act as a thermal insulator. When the shutter 52 is constructed as an insulator and the shutter 52 is in an obstructing position, the shutter 52 serves to increase the thermal isolation of the heating chamber 18 and the cooling chamber 32. The increased thermal isolation allows for an increased temperature difference between the average temperature in the heating chamber 18 and the average temperature in the cooling chamber 32. Specifically, the ratio of the average temperature in the heating chamber 18 to the average temperature in the cooling chamber 32 can be higher than it could be without the shutter 52. As a result, the wafer 28 can be heated and/or cooled more quickly than would be possible without the shutter 52. The increased thermal isolation also reduces the amount of energy required to keep the average temperature in the heating chamber 18 and the cooling chamber 32 within a certain range.

When the shutter 52 acts as a thermal insulator, the shutter 52 also serves to decrease the temperature drop between the shutter 52 and the heating plate 26. Accordingly, the temperature adjacent the top of the shutter is closer to the hot plate temperature than could be achieved without the shutter 52. As a result, the temperature in the heating chamber 18 approaches isothermal which gives rise to improved uniformity of wafer temperature and run-to-run repeatability. Further, the near isothermal nature of the heating chamber 18 results in fewer cold spots being formed in the heating chamber 18. The reduction in cold spots improves the thermal uniformity in the plane of the wafer 28 and between the top and bottom of the wafer 28.

While FIGS. 1A–1C each illustrate the apparatus 10 including a shutter 52, certain embodiments of the invention will not include a shutter 52.

Figure 2A:
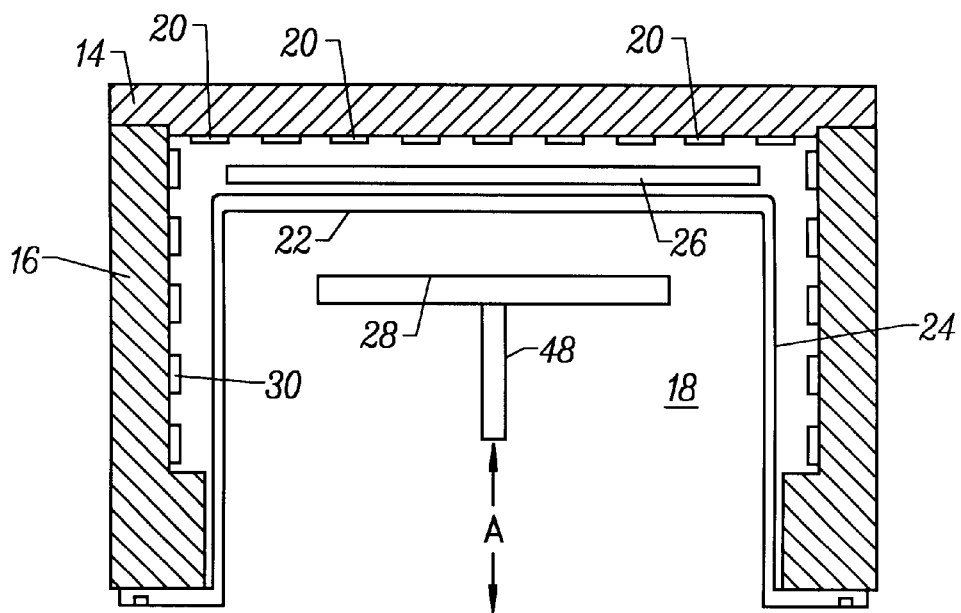
FIG. 2A is a cross section of a heating chamber having a heating plate positioned outside a processing tube.

FIG. 2A illustrates another embodiment of the heat treatment apparatus 10. The heating plate 26 and processing tube 24 are independent of one another. The heating plate 26 is positioned between the processing tube 24 and the heating elements 20. Accordingly, the heating plate 26 serves to provide a more even thermal distribution than can be provided by the processing tube 24 alone.

Figure 2B:
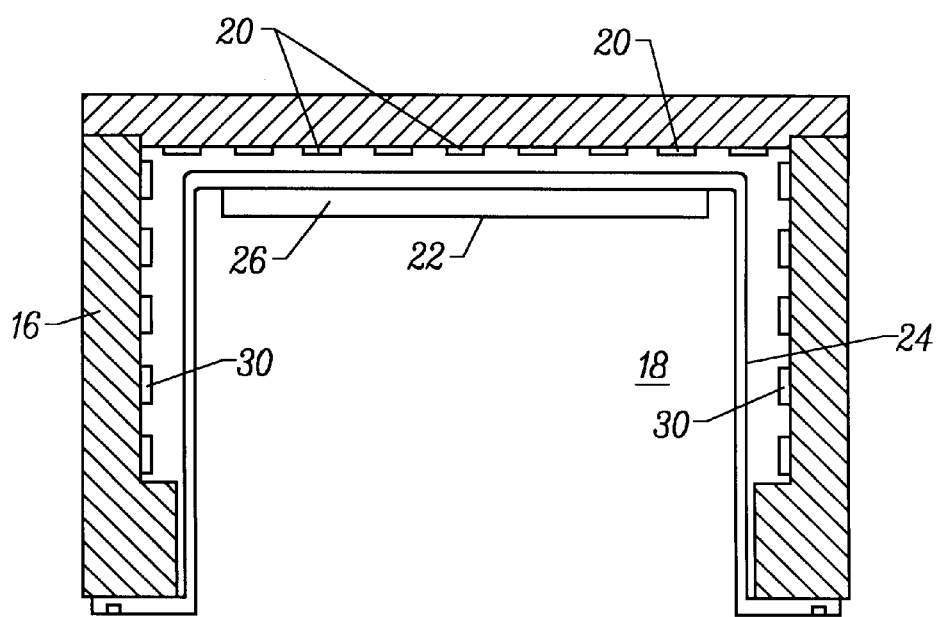
FIG. 2B is a cross section of a heating chamber having a heating plate positioned inside a processing tube.

FIG. 2B illustrates another embodiment of an apparatus 10 where the heating plate 26 and the processing tube 24 are independent of one another. The heating plate 26 is positioned inside the processing tube 24 so the heating plate 25 serves as the upper end 22 of the heating chamber 18. Accordingly, heat from the heating elements 20 passes through the processing tube 24 before being distributed by the heating plate 26. The heating plate 26 can sit flush against the processing tube 24 or an air gap can be formed between the processing tube 24 and the heating plate 26. Other embodiments of the apparatus 10 do not include a heating plate 26. Similarly, the cooling source can be eliminated from certain embodiments of apparatus 10 such as the embodiment of the apparatus 10 illustrated in FIG. 1C.

Figure 3:
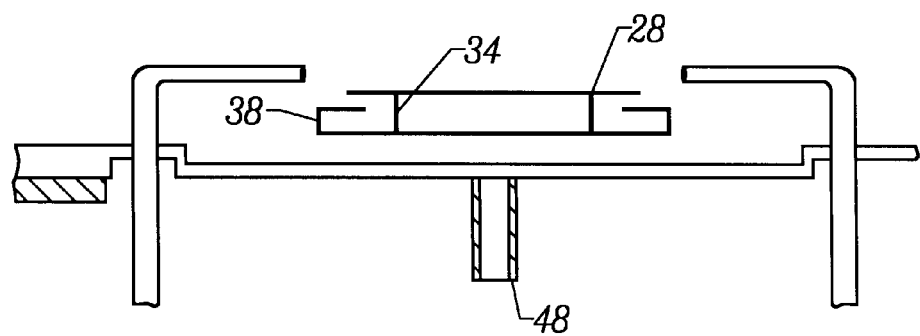
FIG. 3 is a cross section of a cooling chamber having a cooling fluid conduit for delivering a cooling fluid to a wafer.

As illustrated in FIG. 3, the cooling source can include a plurality of cooling fluid conduits for delivery of a cooling fluid. The cooling fluid conduits can be directed so as to be pointed toward the surface of wafer 28 within the cooling chamber 32 or can deliver the cooling fluid into the cooling chamber 32 at a location which is remote from the wafer 28.

Alternatively, the cooling fluid conduit can be shaped as a loop with a perimeter exceeding the perimeter of the wafer holder 38. The loop shaped cooling fluid conduit can be positioned in the cooling chamber 32 so the wafer holder 38 can move through the cooling fluid conduit when the wafer holder 38 is carrying a wafer 28. Additionally, the loop shaped cooling fluid conduit can have cooling fluid ports arranged around the perimeter of the loop. The cooling fluid can be delivered concurrently from a plurality of different cooling fluid ports to achieve a shower of cooling fluid onto a wafer 28 within the cooling chamber 32. The shower effect produces a more uniform cooling to a wafer 28 than is achievable with discrete cooling fluid conduits, and allows forced convection cooling.

Although FIG. 3 illustrates a cooling fluid conduit used without a cooling plate 42, one or more cooling fluid conduits can be used in conjunction with a cooling plate to increase the temperature ramp down of a wafer 28.

As described above, treatment of a wafer 28 in the wafer holder 38 can include delivery of a fluid to a surface of a wafer 28 in the heating chamber 18. The following discussion discloses a variety of fluid delivery systems. Each of the apparatuses 10 illustrated above can be adapted for use with the fluid delivery systems described below. Additionally, the above discussion illustrates that the upper end 22 of the heating chamber 18 can be defined by a heating plate 26 or by the processing tube 24. As a result, the upper end 22 of the heating chambers 18 illustrated below can be defined by a heating plate 26 or the processing tube 24.

Figure 4A:
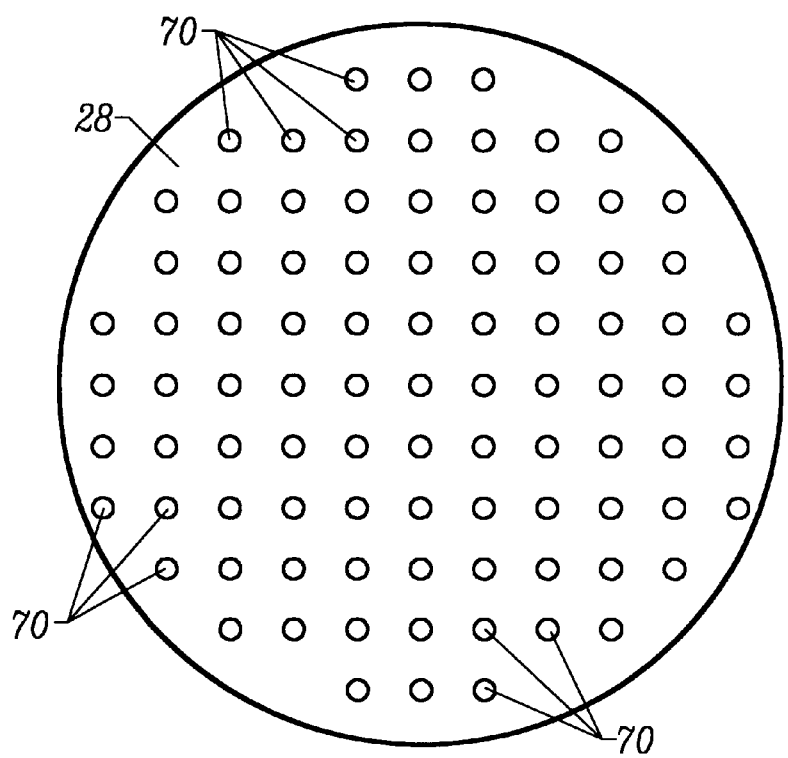
FIG. 4A is a bottom view of an upper end of a heating chamber. A plurality of fluid ports are formed in the upper end.

FIG. 4A provides a bottom view of the upper end 22 of a heating chamber 18. The upper end 22 of the heating chamber 18 includes a plurality of fluid ports 70. These fluid ports are formed in the heating plate 26 or in the processing tube 24 depending on whether the processing tube 24 or the heating plate 26 serves as the upper end 22 of the heating chamber 18. The fluid ports 70 are in fluid communication with one or more fluid sources. The fluid from these fluid sources can be delivered into the heating chamber 18 and/or the cooling chamber 32 through the fluid ports 70. The position of the fluid ports 70 over the wafer 28 permits a downward flow of fluid from the fluid ports 70 onto the wafer 28. An exhaust conduit (not illustrated) can be positioned in either the cooling chamber 32 or in the heating chamber 18 for removing the fluid delivered into the heating chamber 18. A fluid exhaust conduit is preferably positioned near the bottom of the heating chamber 18 so as to be below the wafer 28 during the treatment of the wafer 28. This position of the fluid exhaust port 93 relative to the wafer 28 during treatment of the wafer 28 causes the fluid delivered from the fluid ports 70 in the heating plate 26 to flow downward over the surface of the wafer 28 to the fluid exhaust port.

The fluid ports 70 can be evenly distributed across the upper end 22 of the heating chamber 18 as illustrated in FIG. 4A. For instance, the fluid ports 70 can be arranged in one of several different lattice patterns or in concentric geometric shapes. This even distribution of the fluid ports 70 encourages uniform fluid delivery across the plane of the wafer 28 and can encourage a plug type flow of the fluid from the upper end 22 of the heating chamber 18 toward the wafer 28. This uniformity can be vital in processes such as chemical vapor deposition where a non-uniform distribution of fluids across the wafer 28 can result in uneven deposition results. The number of fluid ports 70 in the heating plate 26 is preferably from 0 to 1000, more preferably from 200–800 and most preferably 550–650. The distance between adjacent fluid ports 70 is preferably between 0.0 and 0.5 inches and is more preferably between 0.1 and 0.4 inches.

Figure 4B:
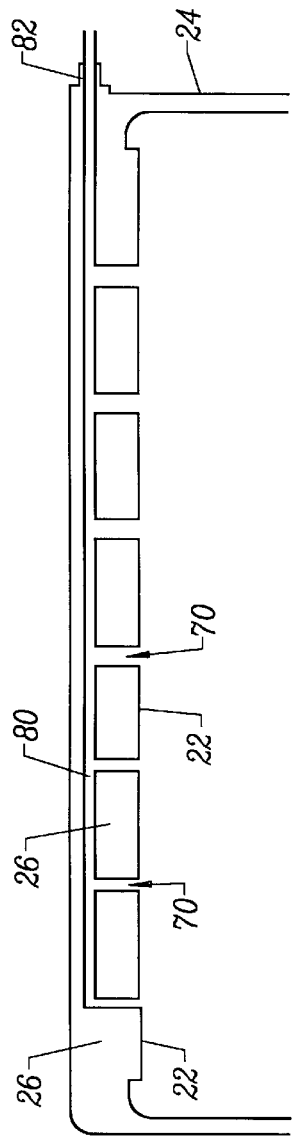
FIG. 4B is a cross section of an upper end of a heating chamber. The upper end includes a lumen coupled with a plurality of fluid ports.

In one example, FIG. 4B provides a cross section of the upper end 22 of a heating chamber 18 having a plurality of fluid ports 70. The fluid ports 70 are coupled with a conduit 80 formed in the heating plate 26. The conduit 80 terminates at a fixture 82 which is configured to be coupled with a fluid conduit. The fluid conduit can be used to transport fluids into the heating chamber 18 through the fluid ports 70 and/or can be used to withdraw fluid from the heating chamber 18 through the fluid ports 70.

Figure 4C:
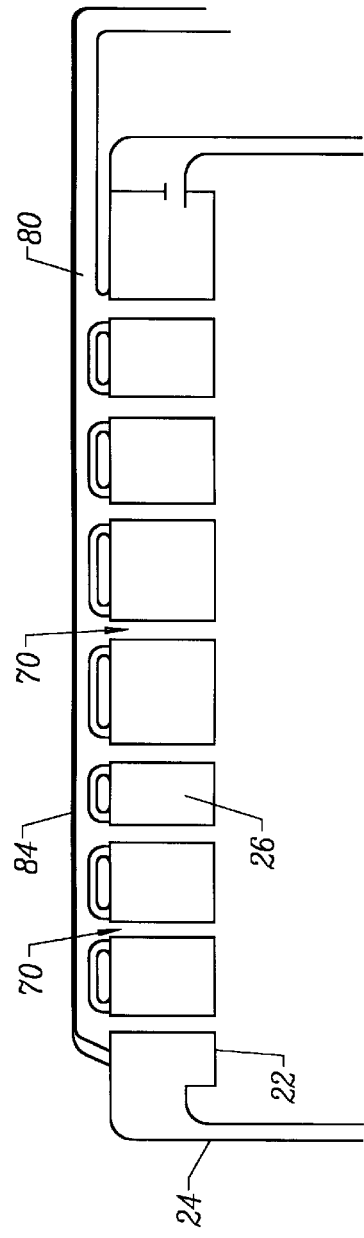
FIG. 4C is a cross section of an upper end of a heating chamber showing a plurality of fluid ports extending through the upper end.

FIG. 4C illustrates another example of the upper end 22 of a heating chamber 18. The fluid ports 70 extend through the portion of the processing tube 24 defining the upper end 22 of the heating chamber 18. An external lumen 84 is coupled to the top of the upper end 22 of the heating chamber 18 such that the lumen is in fluid communication with each fluid port 70.

The fluid ports can be divided into a first group of fluid ports 70 and a second group of fluid ports. The first group of fluid ports 70 can be in fluid communication with a first fluid conduit and the second group of fluid ports 70 can be in fluid communication with a second fluid conduit which is independent of the first fluid conduit. Different fluids can be delivered through the first fluid conduit and the second fluid conduit. As a result, a different fluid can be delivered from the first group of fluid ports 70 than is delivered from the second group of fluid ports 70. Alternatively, the first fluid conduit can be used to deliver fluid into the heating chamber 18 while the second fluid conduit is used to withdraw fluid from the heating chamber 18.

Figure 5A:
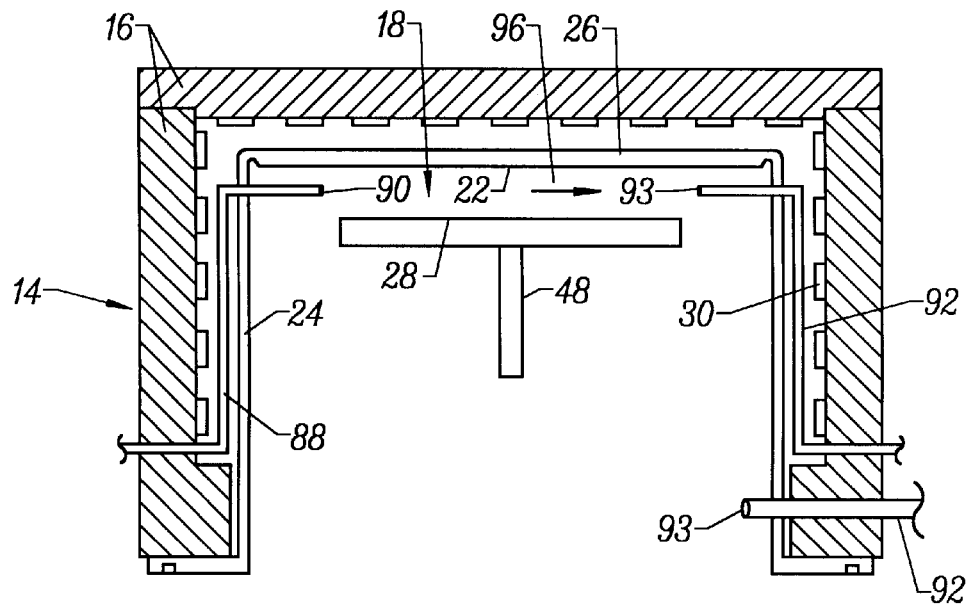
FIG. 5A illustrates a fluid delivery system with a fluid inlet port and a fluid exhaust port positioned to produce a downward flow of fluid within the heating chamber.

FIG. 5A illustrates a fluid delivery system where the heat treatment apparatus 10 includes a fluid inlet conduit 88 terminating in a fluid inlet port 90 and a fluid exhaust conduit 92 terminating in a fluid exhaust port 93. The fluid inlet port 90 and the fluid exhaust port 93 can be positioned anywhere within the heating chamber 18. However, the fluid inlet port 90 and the fluid exhaust port 93 are preferably at a height which allows them to be above the surface of the wafer 28 during treatment of the wafer 28. This position of the fluid inlet port and the fluid exhaust port permits the fluid to be flowed from the fluid inlet port 90 to the fluid exhaust port 93 across the surface of the wafer 28. Accordingly, a fluid flow region is defined between the wafer and the upper end of the heating chamber during treatment of the wafer.

Figure 5B:
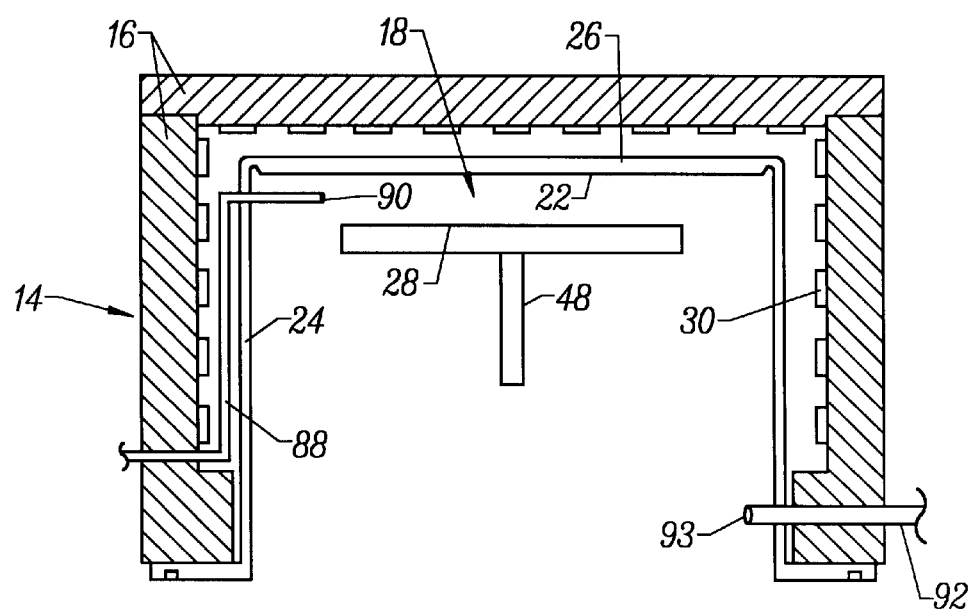
FIG. 5B illustrates a fluid delivery system with a fluid inlet port and a fluid exhaust port positioned to produce a downward flow of fluid within the heating chamber.

As illustrated in FIG. 5B, a fluid inlet port 90 can be positioned above the wafer 28 during treatment of the wafer 28 and a fluid exhaust port 93 can be positioned below the wafer 28 in the heating chamber 18 or within the cooling chamber 32. This position of the fluid inlet port 90 relative to the fluid exhaust port 93 creates a downward fluid flow in the heating chamber 18. Alternatively, the fluid conduits can be operated in reverse so the fluid exhaust port 93 is above the wafer 28 during treatment of the wafer 28 and the fluid inlet port 90 is below the wafer 28 during treatment of the wafer 28.

Figure 6A:
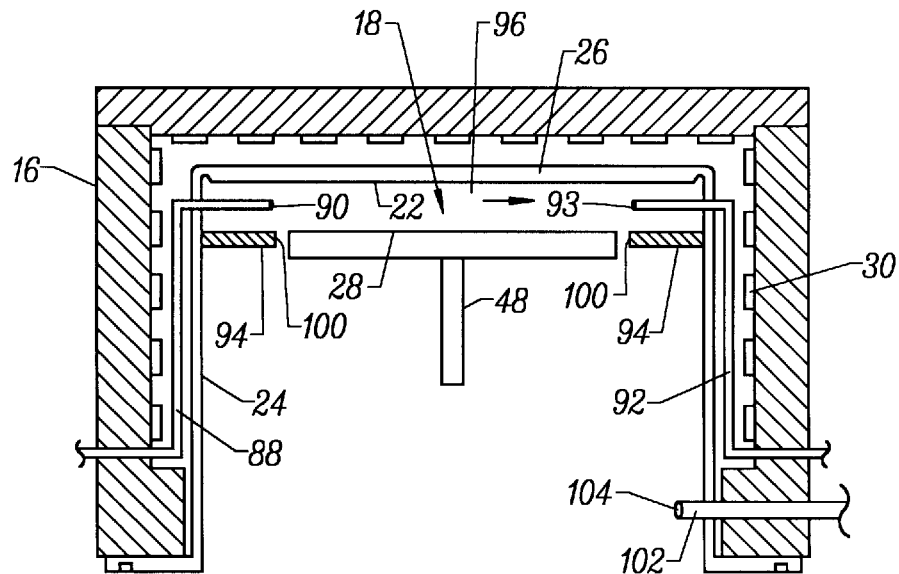
FIG. 6A illustrates a fluid delivery system having a flow containment member extending into the heating chamber from the processing tube.

FIG. 6A illustrates a heating chamber 18 which includes a flow containment member 94 extending inward from the side of the processing tube 24. As illustrated, a wafer 28 can be positioned in the heating chamber 18 so the wafer 28 and the flow containment member 94 define a lower side of a fluid flow region 96 within the heating chamber 18. Suitable materials for the flow containment member 94 include, but are not limited to, high purity quartz, fused silica and silicon carbide. The flow containment member 94 can be integral with the processing tube 24 or can be an independent piece attached to the processing tube 24 with techniques such as welding.

Figure 6B:
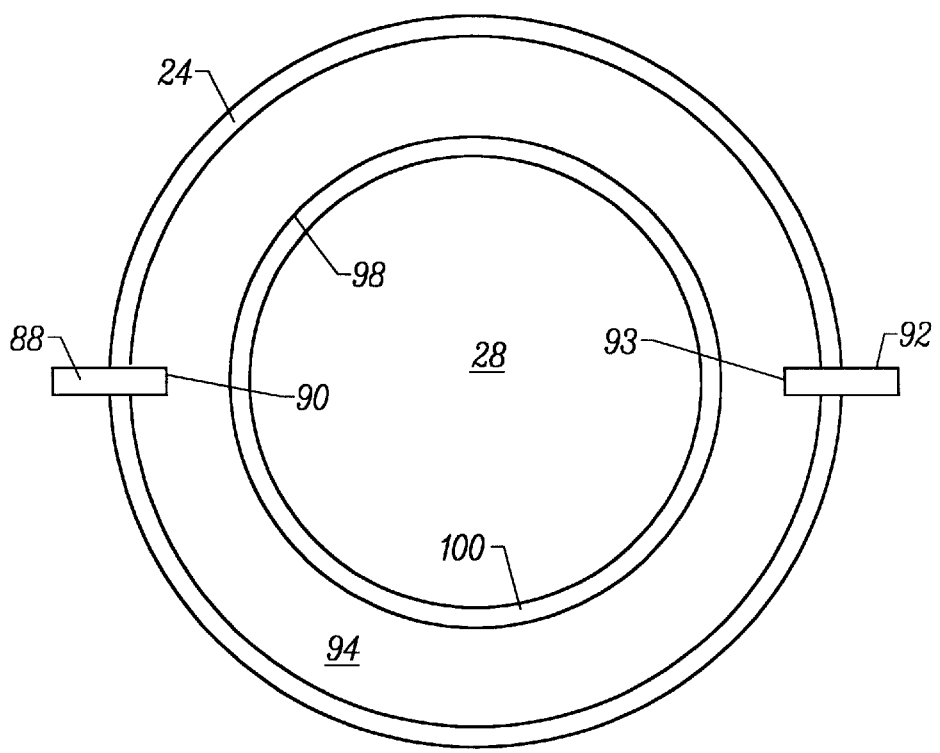
FIG. 6B illustrates the fluid delivery system of FIG. 6A in a processing tube with a rounded cross section.

FIG. 6B is a cross sectional view of processing tube 24 looking downward into the heating chamber 18 at the axes labeled A in FIG. 6A. An inner edge 98 of the flow containment member 94 has a shape complementary to the shape of a portion of the wafer perimeter. Additionally, the inner edge 98 of the flow containment member 94 is larger than the portion of the wafer perimeter to which the inner edge is complementary. The difference in the perimeter size of the wafer 28 and the perimeter size of the inner edge 98 of the fluid containment plate allows a wafer 28 to be positioned adjacent to the flow containment member 94 with a gap 100 formed between the wafer 28 and the inner edge 98 of the flow containment member 94. This gap 100 provides a route where fluids delivered into the fluid flow region 96 can escape the fluid flow region 96. An auxiliary fluid exhaust conduit 102 with an auxiliary fluid exhaust port 104 can optionally be positioned below the flow containment member 94 in order to evacuate fluids which escape from the fluid flow region 96 from the heating chamber 18.

The flow containment member 94 is sized to provide a gap 100 which reduces escape of the fluids from the fluid flow region 96 into the remaining portions of the heating chamber 18.

During delivery of fluid into the heating chamber 18, the wafer 28 is preferably positioned adjacent to the flow containment member 94. The fluid flow region 96 limits the volume of atmosphere within the heating chamber 18 which must be controlled during the treatment of the wafer 28. Since atmospheric conditions are easier to control in a small volume than in a larger volume, the atmospheric conditions are easier to control in the fluid flow region 96 than would be possible to achieve in the entire heating chamber 18. For instance, uniformity of temperature is easier to control in a small volume than in a large volume. Accordingly, the fluid flow region 96 allows for a more easily controlled temperature.

The fluid flow region 96 can simplify the process of changing gasses within the heating chamber 18 while reducing interaction between the gasses. The fluid flow region 96 preferably has a substantially constant distance between the bottom side of the fluid flow region 96 and the upper end 22 of the heating chamber 18. The constant distance encourages a plug flow pattern for the fluid flowing from the fluid inlet conduit to the fluid exhaust conduit. A plug flow pattern allows one gas to follow another gas with only minimal interaction of the two gasses. As a result, fluids within the fluid flow region 96 can be changed by flowing a fluid through the fluid flow region 96, terminating the flow of that fluid and concurrently starting the flow of another fluid through the fluid flow region 96. To further reduce interaction between the fluids, there can be a time delay between terminating the flow of the first fluid and commencing the flow of the second fluid.

Although FIGS. 6A–6B illustrate a single fluid exhaust conduit 92 having a single fluid exhaust port 93 and/or a single fluid inlet conduit 88 with a single fluid inlet port 90, the apparatus 10 can include a plurality of fluid inlet conduits 88 and/or a plurality of fluid exhaust conduits 92. Further, a single fluid inlet conduit 88 can have a plurality of fluid inlet ports 90. Additionally, the apparatus 10 can include a plurality of fluid exhaust conduits 92 and a single fluid exhaust conduit 92 can include a plurality of fluid exhaust ports 93. Increasing the number of fluid conduits and the number of fluid ports in an apparatus 10 permits a greater degree of control over the conditions of the fluid at the surface of the wafer 28.

Figure 6C:
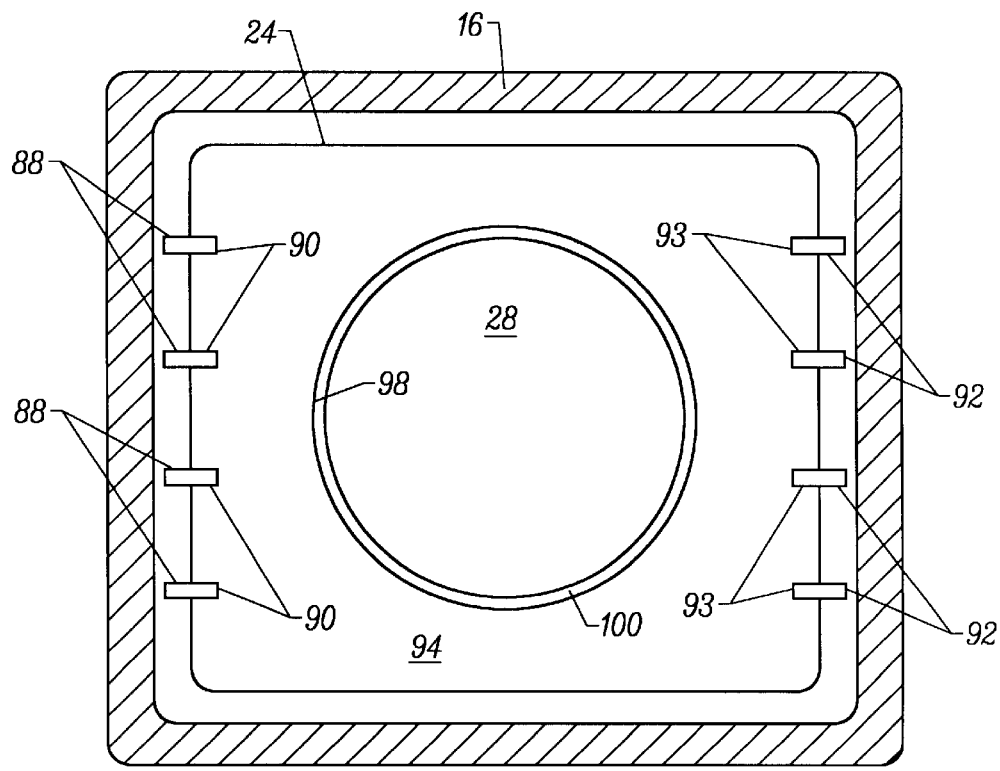
FIG. 6C illustrates the fluid delivery system of FIG. 6A in a processing tube with a rectangular cross section.

FIG. 6C is a cross sectional view of a rectangular shaped processing tube 24 looking downward into the heating chamber 18 at the axis labeled A in FIG. 6A. The apparatus 10 includes a plurality of fluid inlet ports positioned above a flow containment member 94. Each fluid inlet port is aligned with a fluid exhaust port on an opposite side of the fluid flow region 96. The plurality of fluid inlet ports and fluid exhaust ports can increase the plug flow characteristic of the fluid flow across the surface of the wafer 28.

Figure 6D:
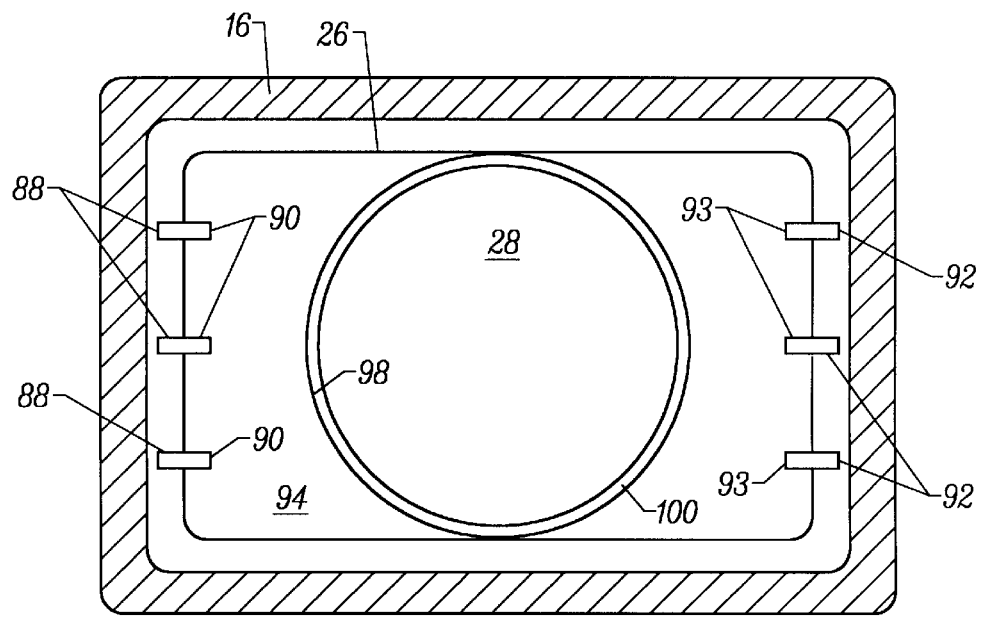
FIG. 6D illustrates a fluid delivery system having a plurality of fluid inlet ports and a plurality of fluid exhaust ports.

FIG. 6D illustrates an apparatus 10 having a plurality of flow containment members 94 arranged on opposing sides of the heating chamber 18. The inner edge 98 of each flow containment member 94 has a shape complementary to the shape of a portion of the wafer perimeter. Additionally, the inner edge 98 of each flow containment member 94 is larger than the portion of the wafer perimeter to which the shape is complementary. As a result, each flow containment member 94 can be positioned adjacent a portion of a wafer 28 with a gap 100 formed between the wafer 28 and the inner edge 98 of the flow containment member 94.

FIG. 7A illustrates a flow distribution member 106 positioned between the flow containment member 94 and the wall of the processing tube 24. The flow distribution member 106 is particularly suited for oxidation and atmospheric pressure processing. A flow distribution member 106 is associated with the fluid inlet conduit and a flow distribution member 106 is associated with the fluid exhaust conduit. The flow distribution member 106 can be positioned at the inner edge 98 of the flow containment plate or can be closer to the wall of the processing tube 24. FIG. 7B is a side view of a flow distribution member 106. A plurality of holes 108 are formed through the flow distribution member 106. The holes 108 preferably have a diameter between 0.01–0.1 inches, more preferably between 0.15–0.02 inches and most preferably between 0.02–0.03 inches. The holes 108 are preferably spaced to achieve a plug type flow from the flow distribution member. The holes 108 can have different sizes to encourage a more even flow. For instance, the holes 108 directly in front of the fluid inlet port can have a smaller diameter than the holes 108 at the periphery of the fluid inlet port. The smaller diameter encourages a flow of fluid to the holes 108 at the periphery. Other embodiments of flow distribution members 106 include, but are not limited to, mesh screens and wire grids. The number, size and arrangement of the holes 108 in a flow distribution member 106 associated with a fluid inlet conduit can be the same as or different from the number of holes 108 in a flow distribution member 106 associated with a fluid exhaust conduit.

The wall of the processing tube 24 and the flow distribution member 106 act together to form a fluid flow distribution chamber 110 around a fluid inlet port. The flow distribution chamber 110 increases the area from which fluid enters the fluid flow region 96 over the area which would be possible without the flow distribution chamber 110. A flow distribution chamber 110 can also be formed around a fluid exhaust port. A flow distribution chamber 110 around a fluid exhaust port can serve to spread out the flow of fluid leaving the fluid flow region 96. As a result, this flow distribution chamber can prevent the fluid within the fluid flow region 96 from converging at the fluid exhaust port. The effect of the flow distribution chambers 110 formed around the fluid inlet port and the fluid chamber formed around the fluid exhaust port is to increase the plug flow characteristics of the fluid flow across the surface of the wafer 28.

A flow distribution chamber 110 can also be constructed in different ways. For instance, the flow distribution chamber 110 can be filled with a porous media or diffusing material such as metal chips.

FIG. 7C is a cross sectional view of a processing tube 24 having a rounded cross section. The flow distribution chamber 110 around the fluid inlet port and the flow distribution chamber 110 around the fluid exhaust port have arc shapes. Although the flow distribution chambers 110 are illustrated as arcing over a 180° range, flow distribution chambers 110 arcing over smaller angular ranges are also contemplated.

Figure 7D:
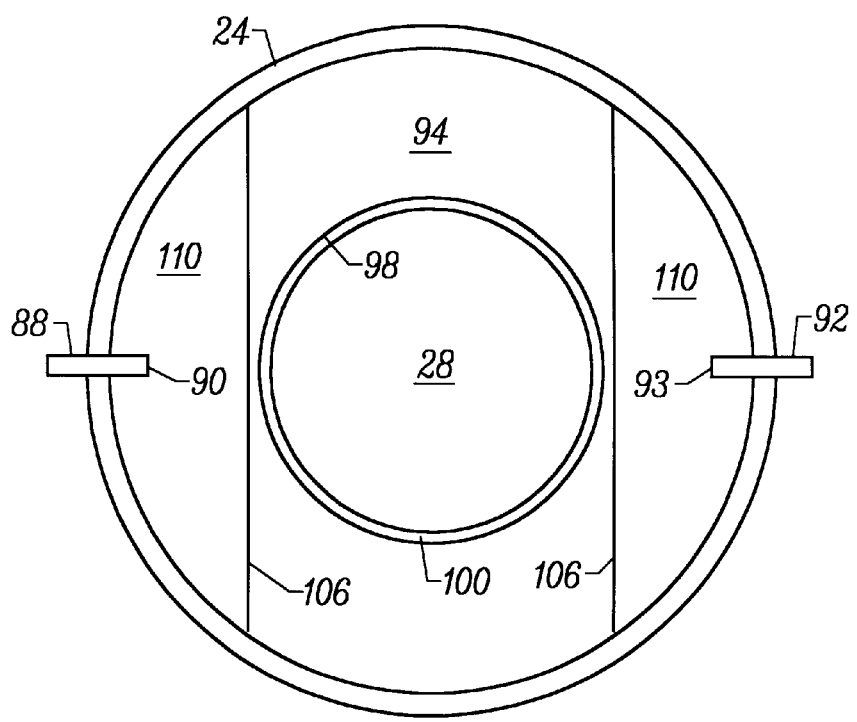
FIG. 7D illustrates a fluid delivery system having a flat flow distribution member in a round processing tube.

FIG. 7D illustrates a processing tube 24 with a rounded cross section and flow distribution members 106 with a straight contour. This geometry has the advantage that the flow distribution chambers 110 are equidistant along their length. As a result, the distance a fluid travels between the flow distribution chambers 110 is more uniform than is possible when the flow distribution member 106 has a curved contour. The increased uniformity can increase the similarity between the fluid flow conditions experienced by the center of the wafer 28 and the conditions experienced at the edge of the wafer 28 midway between the two flow distribution chambers 110.

FIG. 7E is a cross sectional view of a processing tube 24 having a rectangular cross section. The flow distribution members 106 both have a straight contour. This geometry has the advantages associated with flow distribution chambers 110 which are equidistant along their length.

Although FIGS. 7A–7E each illustrate a single fluid inlet port and a single fluid exhaust port associated with each flow distribution chamber 110, each flow distribution chamber 110 can be associated with a plurality of fluid inlet ports and/or a plurality of fluid exhaust ports.

Figure 8:
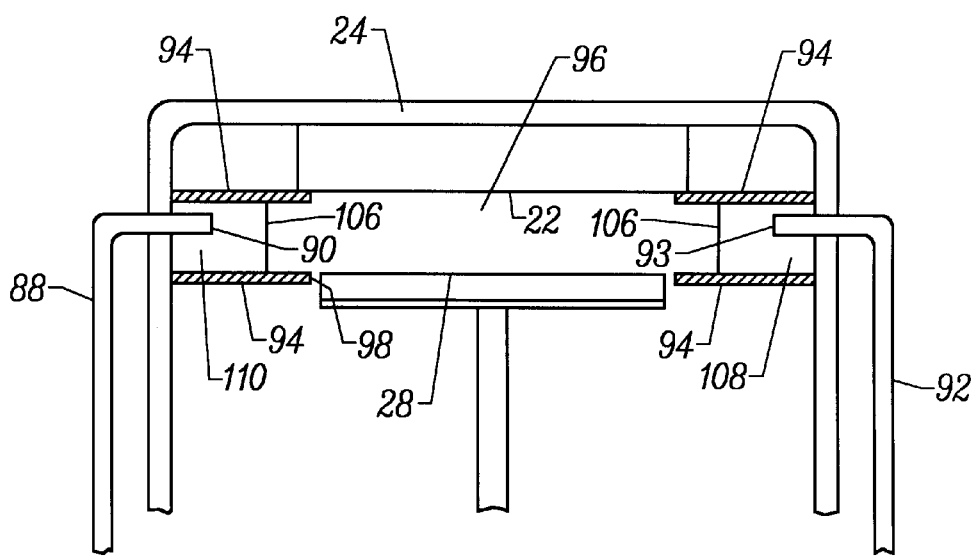
FIG. 8 illustrates a fluid delivery system having a flow containment member coupled with a heating plate.

As illustrated in FIG. 8, the flow distribution chamber 110 can be partially defined by a second flow containment member 94 extending inward from the side of the processing tube 24. The flow distribution member 106 is positioned between the flow containment member 94 and the second flow containment member 94. The second flow containment member 94 can optionally include a recess sized to receive the edge of a heating plate 26. As a result, the second flow containment member 94 can support the heating plate 26. The heating plate 26 can sit flush against the processing tube 24 or an air gap can be formed between the processing tube 24 and the heating plate 26.

A single heating chamber 18 can include several flow distribution chambers 110 positioned at different heights. As a result, a wafer 28 can be treated at different distances from the upper end of the heating chamber 18.

FIG. 9A provides a cross section of a heat treatment apparatus 10 having an enlarged fluid inlet port and an enlarged fluid exhaust port. During treatment of a wafer, the wafer is preferably positioned adjacent the lowest point of the fluid inlet port. A portion of the fluid inlet conduit, the fluid flow region and a portion of the fluid exhaust conduit combine to form a fluid flow passage 112 with a substantially constant cross sectional geometry extending through the portion of the fluid inlet conduit, the fluid flow region and the portion of the fluid exhaust conduit. The substantially constant cross sectional geometry means the fluid flow pattern in one portion of the flow passage 112 is substantially retained through the flow passage 112. This allows the flow pattern in the fluid inlet port to be retained across the fluid flow region. As a result, when a plug type flow is created in the fluid inlet port, the plug type flow is substantially retained through the fluid flow region.

Figure 9D:
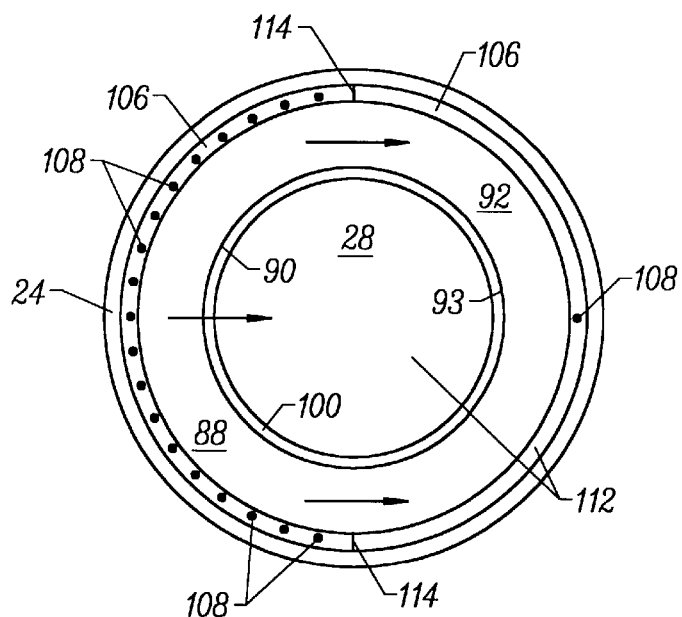

FIG. 9B is a cross section of the processing tube 24 looking down into the tube at the axis marked A and FIG. 9C is a cross section of the processing tube 24 looking up into the processing tube 24 at the axis marked B. The fluid flow region 96 is partially defined by flow region defining walls 114 positioned on opposing sides of the flow region. The flow region defining walls 114 can have a variety of positions relative to the fluid inlet conduit and the fluid exhaust conduit. For instance, FIG. 9D is a cross section of a processing tube 24 where the flow region defining walls 114 are sized to separate the fluid inlet conduit from the fluid exhaust conduit.

A flow distribution member 106 is positioned within the fluid inlet conduit. Similarly, a flow distribution member 106 is positioned within the fluid exhaust conduit. As a result, a flow distribution chamber 110 is formed within the fluid inlet conduit and within the fluid exhaust conduit. The flow distribution members 106 can be positioned at the fluid inlet port or along the length of the fluid exhaust conduit. The flow distribution members 106 serve to spread the fluid flow out over the width of the fluid inlet conduit and/or the fluid exhaust conduit. As a result, the flow distribution members 106 encourage a plug type flow in the fluid flow passage 112.

The fluid inlet conduit and the fluid exhaust conduit have a shape matched to the shape of the fluid flow region 96. As illustrated, the fluid flow region 96 has width about the width of the wafer 28. As a result, the fluid inlet conduit and the fluid exhaust conduit have widths, W, on the order of the wafer diameter. Similarly, the fluid flow region 96 has a thickness about the thickness of the fluid inlet port. As a result, the fluid inlet conduit and the fluid exhaust conduit have a thickness, T, which approximates the thickness of the fluid inlet port. The constant shapes of the fluid inlet conduit, the fluid flow region 96 and the fluid exhaust conduit allows the fluid to retain a similar flow pattern in each of the fluid inlet conduit, the fluid flow region 96 and the fluid exhaust conduit. As a result, the fluid flow pattern at the wafer surface can be controlled by controlling the fluid flow pattern in the fluid inlet conduit.

Although illustrated as being integral with the process tube, a fluid inlet conduit and a fluid exhaust conduit can have shapes matched to the fluid flow region 96 and can be independent of the processing tube 24.

A single processing tube 24 can include a combination of the above fluid delivery systems. For instance, a single apparatus 10 can include fluid ports 70 arranged in a heating plate 26, a fluid inlet conduit 88 and a fluid exhaust conduit 92 positioned on opposing sides of a fluid flow region 96.

Figure 10A:
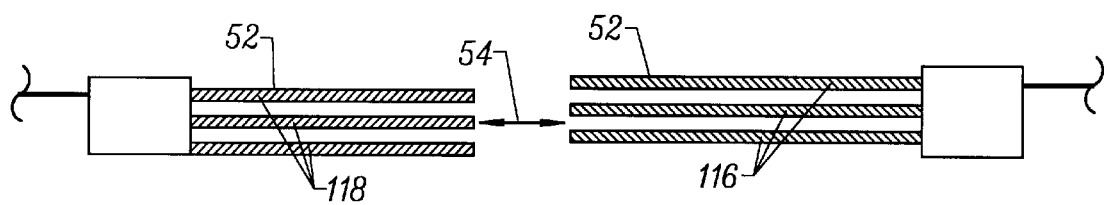
FIG. 10A is a cross section of a shutter in an open position.

FIG. 10A provides a side view of shutters 52 designed to provide thermal insulation. The shutter 52 is constructed from a plurality of members 116. Suitable materials for constructing these members 116 include, but are not limited to, quartz covered insulators, silicon carbide, opaque quartz and fused silica. The members 116 are arranged. to at least partially define open air gaps 118 between adjacent members 116. Because air has a low thermal conductivity, these open air gaps 118 add thermally insulative properties to the shutter 52.

Figure 10B:
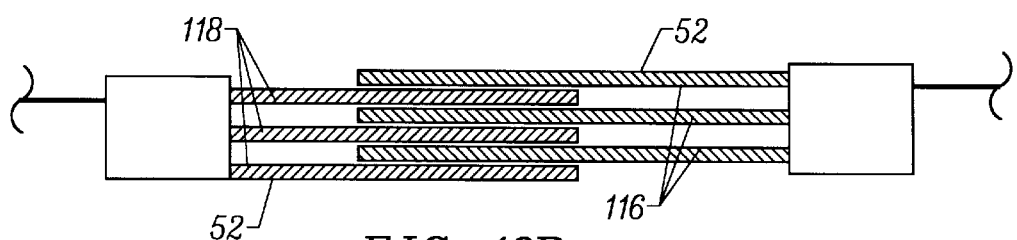
FIG. 10B is a cross section of a shutter in an obstructing position.

The open air gaps 118 have a height which is preferably slightly larger than the thickness of each member 116. The open nature of the air gaps 118 allows the shutters 52 to be meshed together as illustrated in FIG. 10B. Specifically, a portion of one shutter 52 is slidably received within a portion of another shutter 52. When one shutter 52 is slidably received in another shutter 52, the members of the opposing shutters 52 preferably do not touch one another in order to avoid the production of particulates in the heating chamber 18.

Figure 11A:
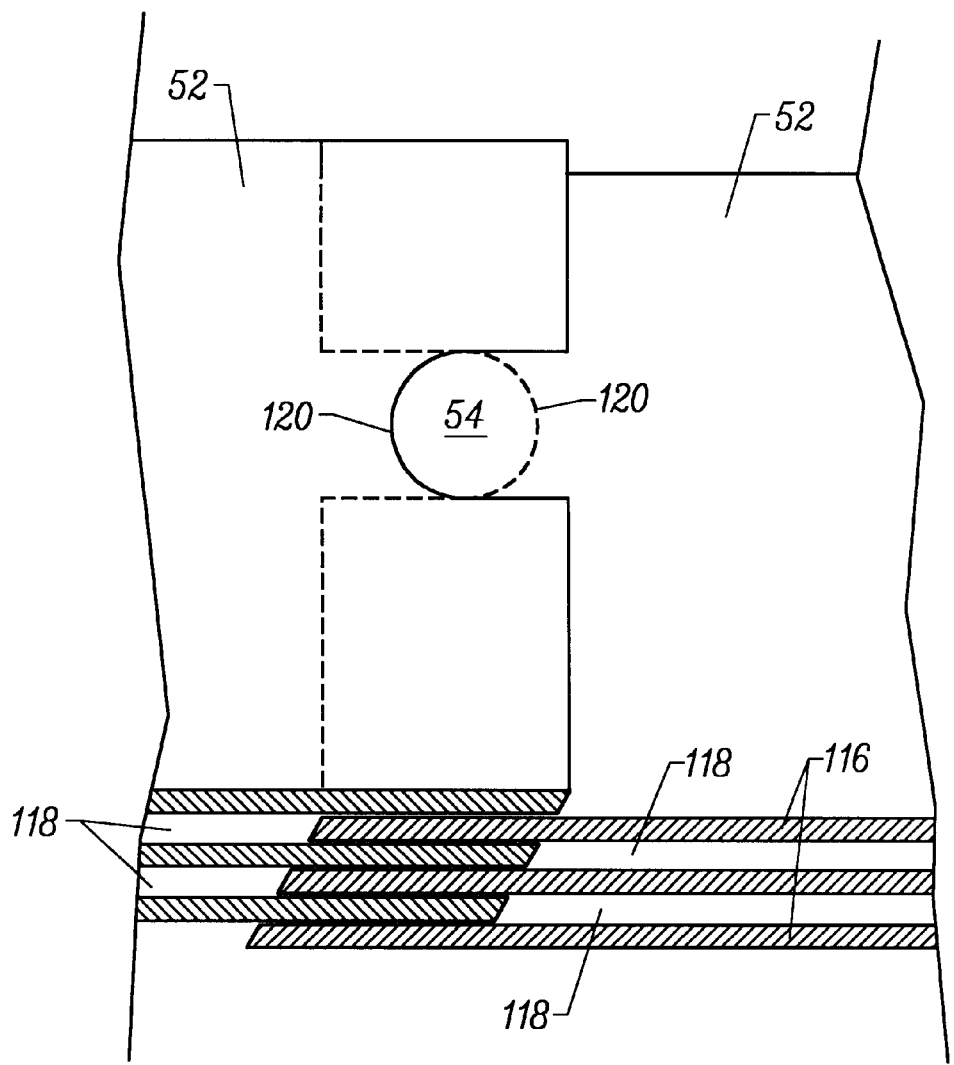
FIG. 11A is a top view of shutters in an obstructing position which is preferred when a wafer holder is positioned in a heating chamber.

FIG. 11A provides a top view of the shutters 52 when they are positioned in the obstructing position illustrated in FIG. 1C. The shutters 52 include recesses 120 which have a geometry matched to the size and shape of the shaft 48 coupled with the wafer holder 38. Accordingly, when the wafer holder 38 is positioned in the heating chamber 18 the shutters 52 can be moved together so they form a passageway 54 with a shape approximating the shape of the shaft 48. Because the passageway 54 has a shape which is complementary to the shaft 48, the shaft 48 fits snugly within the passageway 54 to reduce exchange of gasses between the heating chamber 18 and the cooling chamber 32 and to reduce radiative heat transfer from the heating chamber 18 to the cooling chamber 32. This shape can also serve to reduce radiative heat transfer from the heating chamber 18 to the cooling chamber 32.

Figure 11B:
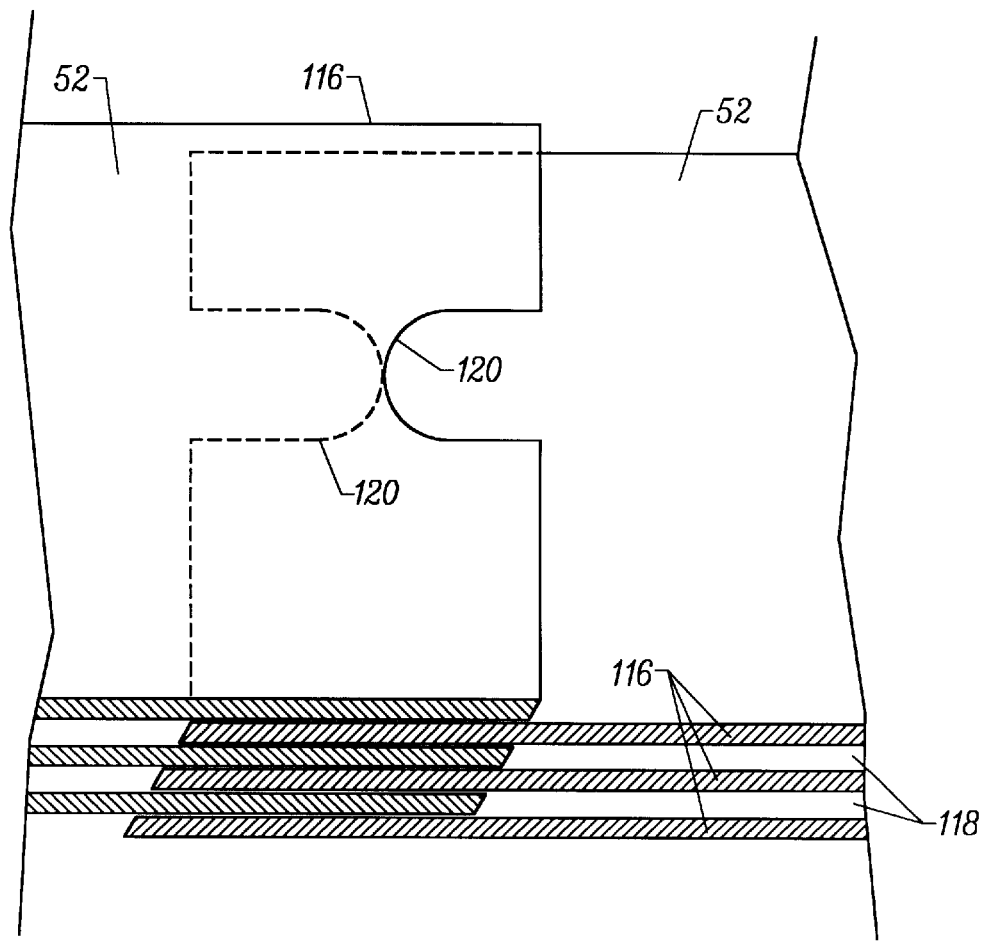
FIG. 11B is a top view of shutters in one example of an obstructing position.

FIG. 11B provides a top view of the shutters 52 when they occupy an obstructing position such as the position of the shutters 52 illustrated in FIG. 1A. The shutters 52 are slid far enough together to effectively close the passageway 54. When the wafer holder 38 is positioned within the cooling chamber 32, the passageway 54 can be closed to increase the thermal isolation of the cooling chamber 32 and the heating chamber 18. Accordingly, the shutter configuration of FIG. 11B is desirable when the wafer holder 38 is positioned in the cooling chamber 32.

Figure 11C:
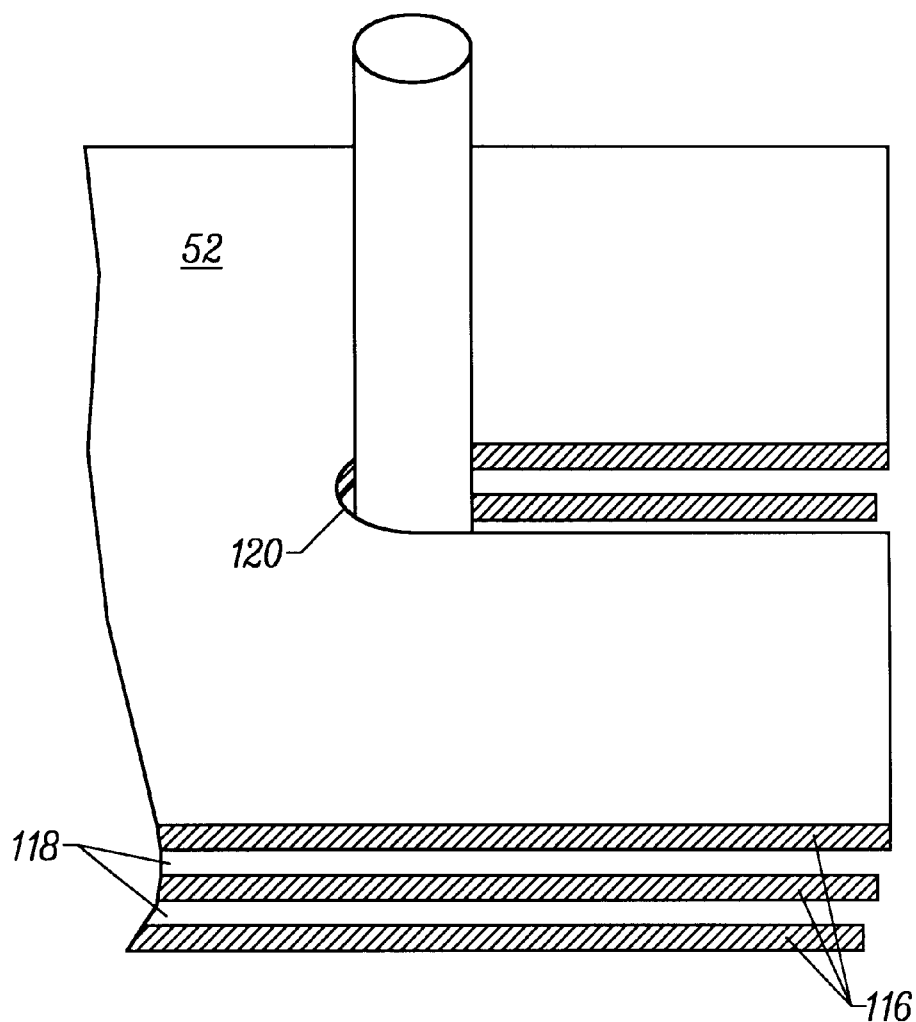
FIG. 11C is a plan view of a shutter having a recess accommodating a shaft.

FIG. 11C illustrates a single shutter 52 which can be used to define the size of the opening. The single shutter 52 includes a deep recess 120 which receives the shutter 52 when the shutter 52 is positioned in an obstructing position and the wafer holder 38 is positioned within the heating chamber 18. The recess 120 is preferably deep enough that the shutter 52 can extend across the passageway 54 between the cooling chamber 32 and the heating chamber 18 when the wafer holder 38 is positioned within the heating chamber 18.

The shutters 52 illustrated in FIGS. 11A–11C include a single recess 120 for accommodating a shaft 48 coupled with the wafer holder 38; however, the shutters 52 can include a plurality of recesses 120 for accommodating a plurality of shafts 48 coupled with a wafer holder 38.

Although the shutters 52 illustrated above are constructed from a plurality of members 116, each shutter 52 can be constructed fro a single member 116. Additionally, each passageway 54 illustrated above is constructed from two shutters 52; however, the apparatus 10 can include three or more shutters 52 which define a single passageway 54. In another embodiment, seven shutters 52 are used which move into one recess.

Figure 12A:
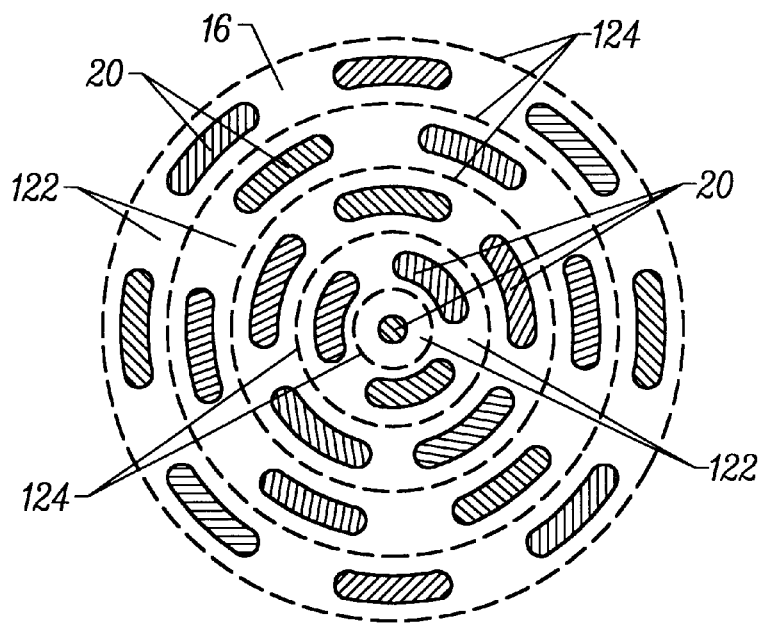
FIG. 12A illustrates a plurality of heating elements arranged in concentric heating zones.
Figure 12B:
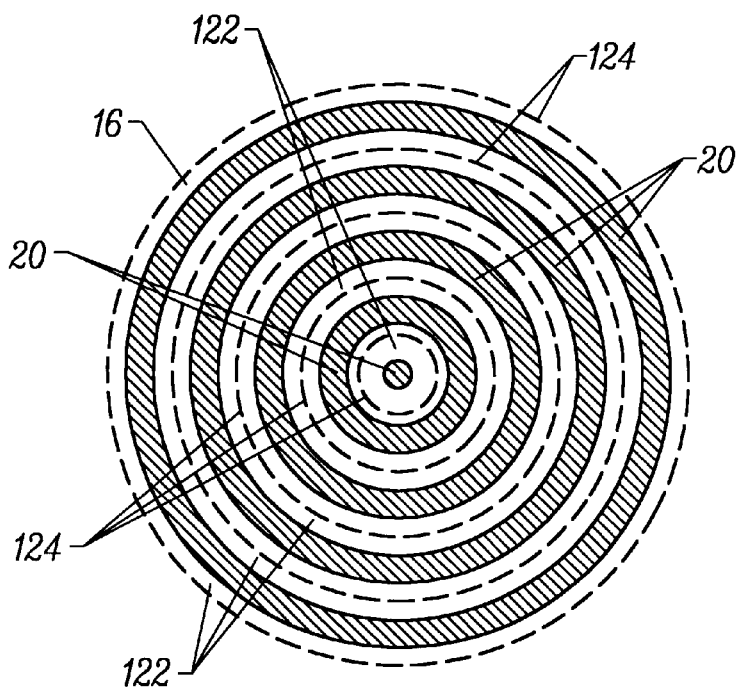
FIG. 12B illustrates heating elements arranged concentrically relative to one another according to one embodiment of the present invention.

FIGS. 12A–12D illustrate possible arrangements for the heating elements 20 used with the apparatuses 10 disclosed above. The heating elements 20 are each arranged in concentric heating zones 122. The heating elements 20 in a particular heating zone 122 can be arranged in concentric circles as illustrated in FIG. 12A. Alternatively, a single heating element 20 with a rounded geometry can occupy a heating zone 122 as illustrated in FIG. 12B. The heating elements 20 in different heating zones 122 are preferably controlled independently. When multiple heating elements 20 are included in a particular heating zone 122, the heating elements 20 can be eclectically connected in series or in parallel or can be independently controlled. Thermocouples may be placed in the center of each zone to provide temperature feedback.

Figure 12C:
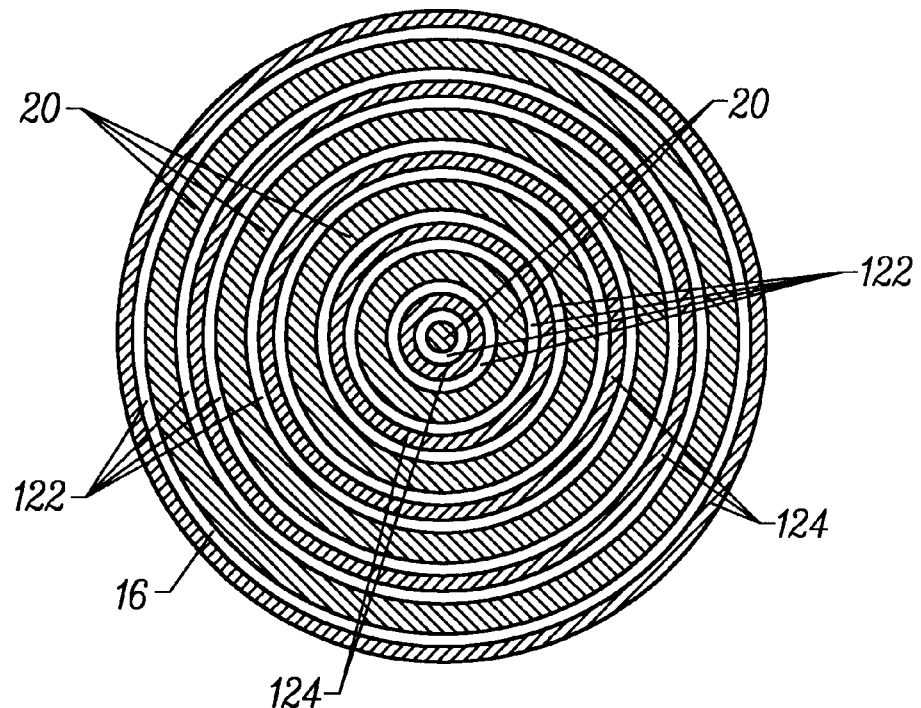
FIGS. 12C and 12D illustrates thermal isolation barriers arranged between heating zones according to one example of the present invention.
Figure 12D:
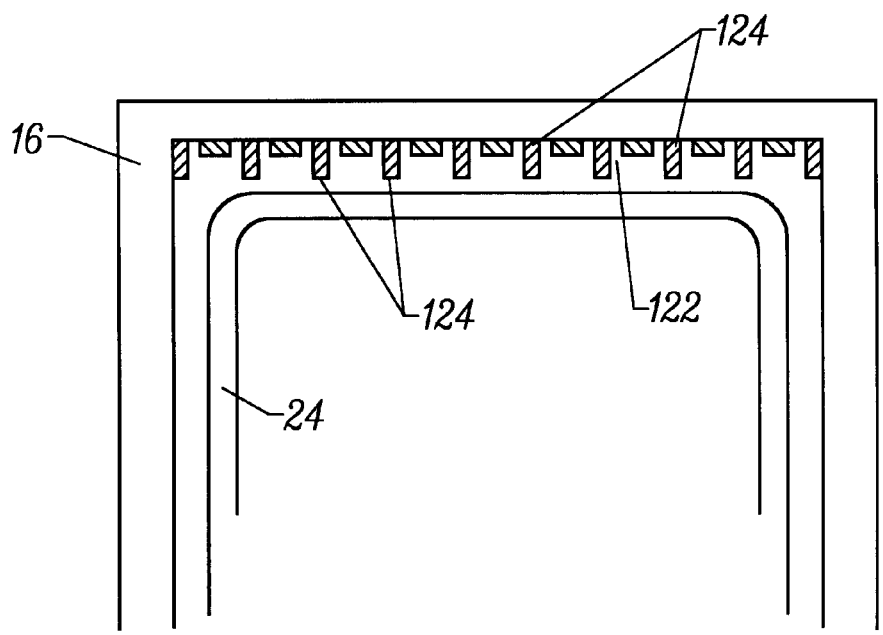

Thermal isolation barriers 124 can be positioned between the heating zones 122 as illustrated in FIG. 12C. As illustrated in FIG. 12D, the thermal isolation barriers 124 can extend from the thermal insulator 16 toward the processing tube 24 and can be coupled to the processing tube 24. In another embodiment, the thermal isolation barriers 124 extend from the insulation toward a heating plate 26 and can be coupled to the heating plate 26.

The thermal isolation barriers 124 can reduce the cross talk of the heat produced by the heating elements 20 in different heating zones 122. As a result, the heat produced in a particular heating zone 122 is directed toward the heating plate 26 or the processing tube 24. Accordingly, adjustments made to a particular heating element 20 affect primarily the portion of the heating plate 26 or the processing tube 24 which are adjacent the adjusted heating element 20. As a result, the thermal isolation barriers 124 serve to increase the degree of control over the thermal conditions within the heating chamber 18. Although FIGS. 12A–12D illustrate a processing tube 24 having a rounded cross section, the heating elements 20 and thermal isolation barriers 124 can be adapted to processing tubes 24 having a rectangular cross section.

Figure 13:
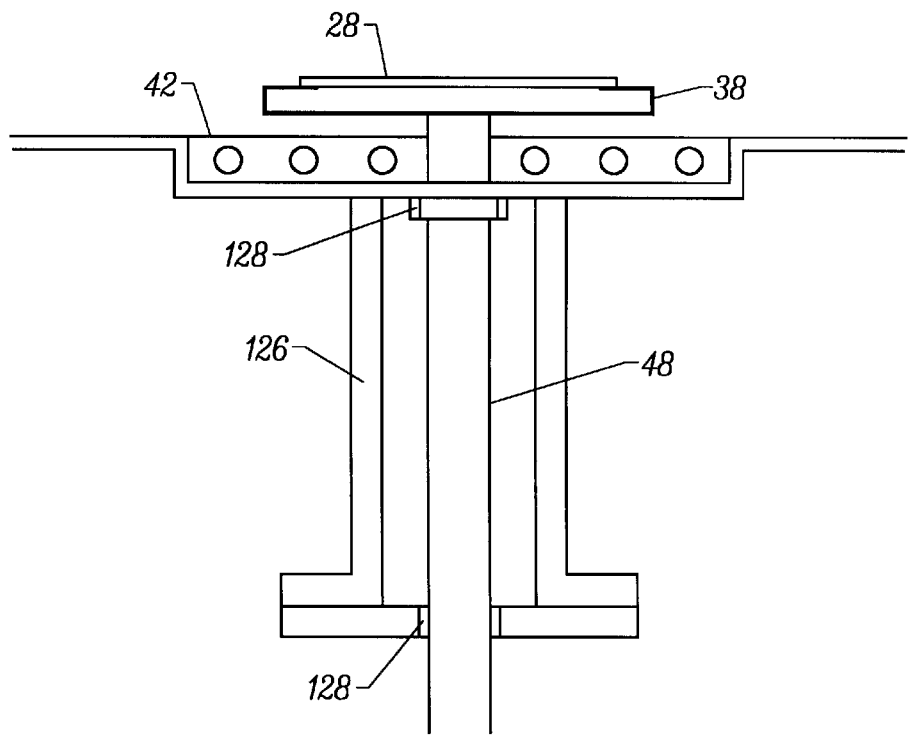
FIG. 13 illustrates a shaft conduit extending from a cooling chamber.

FIG. 13 illustrates an apparatus 10 having a shaft conduit 126 extending from the cooling chamber 32. The shaft conduit 126 encloses a portion of the shaft 48 extending below the cooling chamber 32. The shaft conduit 126 can be integral with the frame of the cooling chamber 32 or can be an independent piece which is attached to the frame of the cooling chamber 32. Alternatively, the shaft conduit 126 can be a bellows (not shown), having an "accordion" shape. Any of the apparatuses 10 disclosed above can be adapted for use with the shaft conduit 126.

A seal 128 is formed between the shaft conduit 126 and the shaft 48 at a position which is remote from the cooling chamber 32. The seal 128 serves to reduce the escape of fluids from the cooling chamber 32 and/or to reduce the entry of fluids from the atmosphere into the cooling chamber 32. As a result, the seal 128 helps to increase the thermal and physical isolation of the cooling chamber 32 from the atmosphere. This isolation enhances the controllability of the atmosphere within the cooling chamber 32.

The remote location of the seal 128 reduces the heat to which the seal 128 is exposed. For instance, while the wafer 28 is positioned within the heating chamber 18, the portion of the shaft 48 within the heating chamber 18 heats up. However, lower portions of the shaft 48 retain cooler temperatures because they are nearer the cooling chamber 32 and/or because they spend less time in the heating chamber 18. The position of the seal 128 remote from the cooling chamber 32 results in exposure of the seal 128 to lower portions of the shaft 48 than would occur if the seal 128 were within or adjacent to the cooling chamber 32. As a result, the position of the seal 128 remote from the cooling chamber 32 can serve to protect the seal 128 from heat damage and can accordingly preserve the seal 128. The distance of the seal 128 away from the cooling chamber 32 is preferably equal to about the maximum distance which the shaft 48 extends into the heating chamber 18.

A seal 128 can be formed at the junction of the cooling chamber 32 and the shaft 48. Such a seal 128 is an alternative to, or can be used in conjunction with, the seal 128 between the shaft 48 and the shaft conduit 126.

The invention also relates to a method of operating the apparatus 10. During operation of the heat treatment apparatus 10 the wafer holder 38 can be positioned anywhere within the heating chamber 18 during the ramp up of the wafer 28 temperature. However, the wafer 28 is preferably positioned so close to the heating plate 26 that the heat is conducted to the wafer 28 through the air between the heating plate 26 and the wafer 28. Because the wafer 28 is also receiving the heat rays radiated from the heating plate 26, the close proximity of the wafer 28 and the heating plate 26 causes the wafer 28 to be concurrently heated by both radiation and conduction. These two heat transfer mechanisms provide an accelerated temperature ramp up. The invention is not limited however, and the heat treatment apparatus may be operated in a non-conductive mode where the wafer is away from the hot plate.

During temperature ramp up and when the wafer 28 is close enough to the heating plate 26 for conduction to occur, the percentage of heat transferred to the wafer 28 by conduction is preferably 20–90%, more preferably between 20–70%. During the temperature ramp up the wafer 28 is preferably positioned within 2 mm of the heating plate 26 and more preferably within 1 mm of the heating plate 26. However, the distance between the wafer 28 and the heating plate 26 which is required to achieve a particular degree of heat transferred by conduction is a function of the temperature at the heating plate 26. For instance, when the temperature of the heating plate 26 is approximately 900° C., the wafer 28 is preferably positioned within 2 mm of the heating plate 26. However, when the temperature of the heating plate 26 is approximately 500° C., the wafer 28 is preferably positioned within 0.8 mm of the heating plate 26. The distance between the wafer 28 and the heating plate 26 can be varied during treatment of the wafer in order to control the heating rate. For instance, the ramp up rate can be increased by moving the wafer closer to the heating plate 26.

Figure 14:
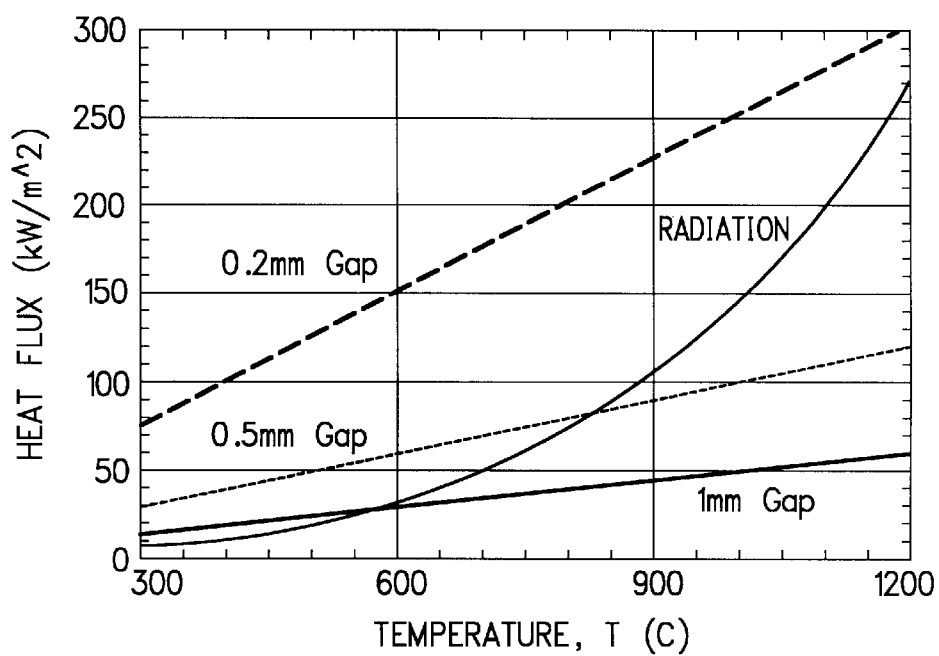
FIG. 14 illustrates the relative contributions of heat transfer from conduction and radiation.

FIG. 14 illustrates the heat flux due to radiation compared with the heat flux due to conduction at two different displacements of the wafer from the heating plate 26. Heat transfer occurs mainly by radiation, however; as illustrated, the percentage of heat flux from conduction increases with proximity of the wafer to the heating plate 26. For instance, at 900° C. and 0.2 mm from the heating plate 26, the heat flux due to conduction is about two thirds of the total heat flux. However, at 900° C. and 1 mm from the heating plate 26, the heat flux due to conduction is reduced to about one third of the total heat flux. As a result, a wafer must be placed in close proximity to the heating plate 26 in order to obtain the benefits of conductive heat flux.

Once a target condition has been achieved at the wafer 28, the wafer 28 can be treated. For instance, once the wafer 28 reaches a target temperature, a fluid can be delivered into the heating chamber 18. Alternatively, once the target condition has been achieved at the wafer 28, the wafer 28 can be backed away from the heating plate 26. Backing the wafer 28 away from the heating plate 26 can serve to move the wafer 28 under a fluid inlet port 90 coupled with a fluid inlet conduit 88 or can provide improved flow characteristics of a fluid over the wafer 28 by increasing the clearance between the wafer 28 and the heating plate 26.

During treatment of the wafer 28, the wafer 28 can be rotated by rotating the wafer holder 38. When the wafer 28 is rotated, the wafer 28 is preferably rotated at 0 to 600 r.p.m. and more preferably at 5 to 15 r.p.m. The rotation of the wafer 28 can serve to provide a more uniform exposure of the wafer 28 to fluids delivered into the heating chamber 18 during the treatment of the wafer 28. The rotation of the wafer 28 can also provide a more uniform thermal budget.

Once the wafer 28 has been treated within the heating chamber 18, the shutters 52 can be opened and the wafer holder 38 can be lowered into the cooling chamber 32. A target condition can then be achieved at the wafer 28 before the wafer 28 is removed from the wafer holder 38. For instance, the wafer 28 can be reduced to within a range of target temperatures before the wafer 28 is removed from the wafer holder 38.

In another embodiment of the present invention, a wafer holder and heat treatment apparatus configured to promote more uniform heating of the wafer supported by the wafer holder is provided. More specifically, a wafer holder and heat treatment apparatus is provided which minimizes thermal stresses in the wafer during heating and cooling in the heat treatment apparatus. During heating of the wafer in the heating chamber the peripheral edge of the wafer will heat up more rapidly than the center of the wafer. Similarly, during cooling the peripheral edge of the wafer will cool down more rapidly than the center of the wafer. These differences in temperature between the edge and the center of the wafer create thermal stresses within the wafer. Such thermal stresses are problematic, particularly at high temperatures, and can lead to failure of the semiconductor devices formed on the wafer.

Figure 15A:
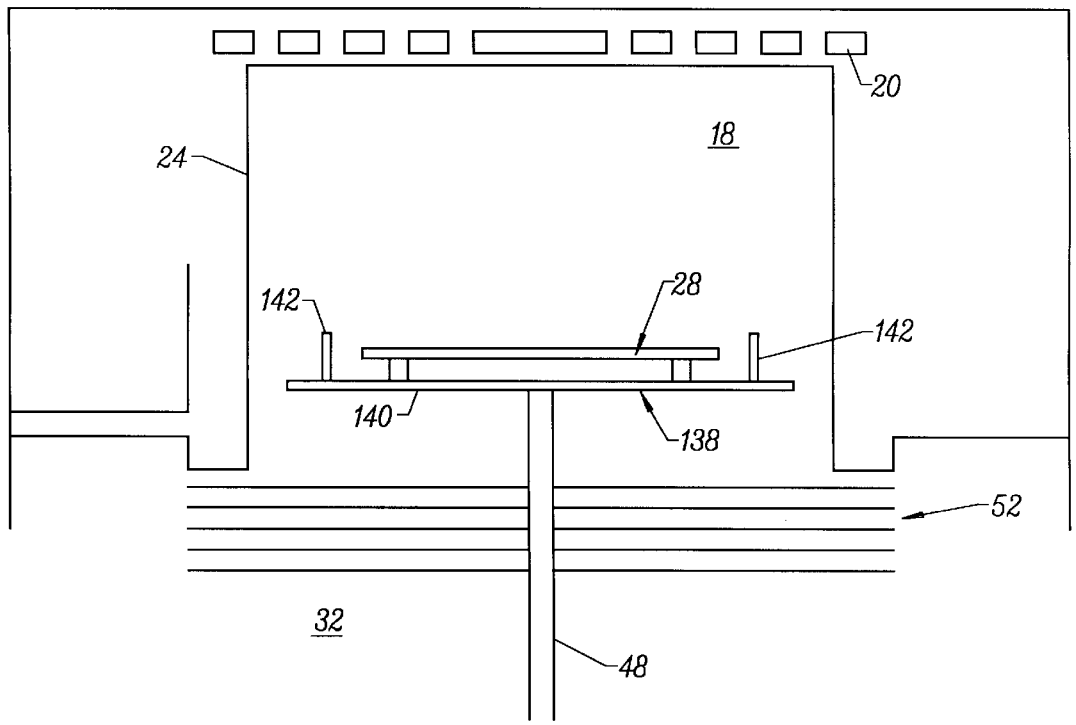
FIGS. 15A and 15B are cross sectional views of a wafer holder according to one embodiment of the present invention.
Figure 15B:
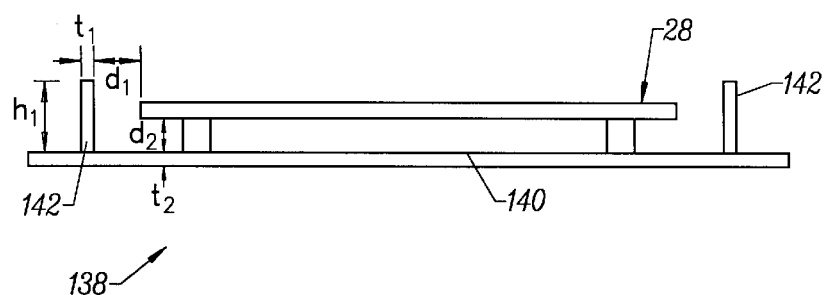

To address this problem, the wafer holder and apparatus of the present invention is configured to slow down the thermal ramp rate of the peripheral edge of the wafer. This is accomplished by employing a wafer holder having an edge effect member located proximate to at least a portion of the peripheral edge of the wafer. One embodiment of a wafer holder having an edge effect member in accordance with the present invention is illustrated in FIG. 15. The wafer holder 138 generally includes one or more wafer support members 140 and an edge effect member 142. The one or more wafer support members 140 retain the wafer 28 in the wafer holder 138 and support the wafer in a substantially planar manner. The wafer support members 140 may be any suitable support members and are not limited to any particular design. Examples of suitable support members 140 include, but are not limited to, a plurality of upwardly extending pins, a flat base plate, a recessed base plate, an annular ring, a guard ring, and the like. Preferably, the wafer support members 140 will provide for secure support and retention of the wafer during rotation of the wafer support. The wafer holder 138 is coupled to the shaft 48 which raises and lowers the wafer holder within the heat treatment apparatus. 10.

Of particular advantage, the wafer holder 138 includes an edge effect member 142. As described in further detail below, the edge effect member 142 acts to minimize the temperature differential that occur between the wafer edge, and the center of the wafer, during heating and cooling of the wafer in the heat treatment apparatus. Turning again to FIG. 15, the wafer holder 138 having an edge effect member 142 according to one embodiment is shown. The wafer holder 138 includes a support member 140 comprised of a flat base plate 141 that extends the entire diameter of the wafer, and an upwardly extending edge effect member 142 positioned near the outer edges of the base plate 141. The edge effect member 142 is spaced apart from the peripheral edge of the wafer 28. The edge effect member 142 is comprised of a vertically oriented (i.e. normal to the wafer) circular band, that extends upwardly from the base plate 141 and encircles or rings at least a portion of the peripheral edge of the wafer 28. Preferably, the edge effect member 142 encircles the substantial peripheral edge of the wafer, and most preferably the edge effect member 142 encircles the entire periphery of the wafer. The edge effect member 142 may be formed integral with the base plate 141 or can be an independent piece that is attached to the base plate 141 via known techniques such as welding. In this embodiment, the edge effect member 142 extends above the position of the wafer, thereby creating a thermal barrier around the periphery of the wafer. Thus, in addition to providing a thermal mass near the edge of the wafer, the edge effect member 142 also blocks any radiation emanating from the side walls of the heating chamber.

The edge effect member 142 provides a thermal mass located near the peripheral edge of the wafer. This thermal mass will draw heat away from the edge of the wafer during heating if the temperature of the thermal mass lags behind the temperature of the wafer during heating. To promote this behavior, the wafer holder with edge effect member is designed to have a thermal mass to energy absorption ratio larger than that of the wafer (or other substrate material). The wafer holder and its edge effect members will have a thickness, specifically $t_1$, and $t_2$ as illustrated in FIG. 15. Wafer holder materials which will provide a suitable thermal mass include but are not limited to, quartz, silicon carbide, $Al_2O_3$, fused silica, silicon, or ceramic. The wafer holder and the edge effect member are typically formed of the same material. However they can be formed of different materials. Thickness values ($t_1$, and/or $t_2$) of the wafer holder that will provide a suitable thermal mass are in the range of about 0 to 10 mm, more preferably in the range of about 0.5 to 4 mm, with a range of about 0.75 to 2 mm being most preferred. It will be apparent to those of ordinary skill in the art, that the above described parameters, such as the design conditions of volume and thickness and the material characteristics of density, specific heat, emissivity and reflectivity can be selected to produce the desired thermal mass to energy absorption ratio and thus the desired temperature profile across the wafer can be tailored. Of course, different types of heating apparatus and different types of wafers may require different sizes and placement of the edge effect member. For a silicon wafer, the desired objective is typically to minimize the temperature deviation within the wafer (i.e. between the edges and the center), and thus the edge effect member is employed to promote substantially uniform heating and cooling across the wafer.

In the preferred embodiment, the edge effect member according to the present invention is comprised of an opaque or partially opaque material. This provides the additional advantage of selectively blocking radiative heat transfer from the heating source to the edges of the wafer. The edge effect member may be placed in a variety of orientations relative to the wafer to tailor the blocking of the radiative heat transfer. For example, as described in more detail below, the edge effect member may be placed above the peripheral edge of the wafer thereby blocking radiation from the edge of the wafer that emanates from the heating source in the upper end of the heating chamber. Preferred materials that provide an opaque or partially opaque material include, but are not limited to, quartz, silicon, silicon carbide, or fused silica For all the embodiments described herein, the edge effect member is spaced apart from the peripheral edge of the wafer by a distance d, as illustrated in FIGS. 15 and 16A to 16D. To provide the desired thermal affect, the edge effect member should be placed at a distance "d" of up to approximately one inch from the peripheral edge of the wafer 28. Preferably, the edge effect member is placed at a distance d of approximately 0.5 to 10 mm from the peripheral edge of the wafer 28.

While one embodiment of the edge effect member 142 is illustrated in FIG. 15, the configuration of the edge effect member 142 may take a variety of forms. Alternative embodiments are shown in FIGS. 16A to 16B. In FIG. 16A a wafer holder with a similar configuration as that shown in FIG. 15 is illustrated with a vertically orientated edge effect member encircling the peripheral edge of the wafer; except in this embodiment, the support member 140 is comprised of two outwardly extending, opposed plates 144 and 145 which support the wafer along its edges as opposed to the flat base plate 141 that extends the entire diameter of the wafer. Alternatively, the support member 140 is comprised of a circular support disk or ring 143 (FIG. 17) which supports the wafer along its periphery.

Two alternative embodiments of the wafer holder are shown in FIGS. 16B and 16C. The wafer holder 138 is comprised of a support member 146 and an edge effect member 148. In this embodiment the edge effect member 148 is spaced apart from the peripheral edge of the wafer 28 and is comprised of a horizontally oriented (i.e. parallel to the wafer) circular band that encircles at least a portion or the peripheral edge of the wafer. Preferably, the edge effect member 148 encircles the substantial peripheral edge of the wafer 28, and most preferably it encircles the entire periphery of the wafer. The edge effect member 148 may be placed either underneath the peripheral edge of the wafer as illustrated in FIG. 16B, or above the peripheral edge of the wafer as illustrated in FIG. 16C. When the edge effect member is positioned above the peripheral edge of the wafer, the wafer holder provides the added effect of preventing radiative heat transfer to the edge of the wafer from the heating source in the upper end of the heating chamber. This, in addition to the thermal affect of the edge effect member, helps to slow the heat up of the edge of the wafer and thus brings the ramp rate of the edge of the wafer closer to that of the center of the wafer, thereby reducing the temperature non-uniformity within the wafer 28.

To provide the desirable thermal mass affect to the edge of the wafer, when the edge effect member 148 is positioned parallel to the wafer, either above or below the wafer, the edge effect member 148 should extend over the wafer edge. The edge effect member 148 will extend over (or under, as the case may be) the edge of the wafer by approximately 0–10 mm. The support member 140 may be comprised of any suitable support. For example, in FIG. 16B where the edge effect member 148 is positioned below the wafer, the support member 140 is comprised of a plurality of straight pins 150 which are carried by and extend upward from the horizontal edge effect member 148 to engage the underside of the wafer 28. Alternatively, the pins could be carried by another member extending from the chamber walls as opposed to being carried by the edge effect member. A retaining ring may also be used.

In the alternative embodiment shown in FIG. 16C where the edge effect member 148 is positioned above the wafer, the support member 140 is comprised of an L-shaped member 152 carried by the edge effect 148 which hangs from the edge effect member and has an outwardly projecting portion 153 which projects under the wafer. The outwardly projecting portion 153 includes a plurality of pins 154 to engage the underside of the wafer 28. As will be apparent to those of ordinary skill in the art, the support member 140 may take a variety of configurations, and is not limited to the exact embodiments shown here. The only limitation is that the support member provide secure support of the wafer.

Another embodiment of the present invention is illustrated in FIG. 16D. In this embodiment, the edge effect member 148 is comprised on two portions, an upper 156a and lower 156b portion, and resembles an upside-down L shaped band that encircles at least a portion of the wafer. The upper portion 156a is parallel to the horizontal plane of the wafer, and is positioned spaced apart and above the wafer. The upper portion 156a extends over the wafer edge and thus provides the additional affect of blocking at least a portion of the radiative heat transfer from the heat source in the upper end of the chamber to the wafer edge. Coupled to the upper portion 156a is the lower portion 156b. The lower portion 156b is vertically oriented, normal to the horizontal plane of the wafer, and is positioned spaced apart from the wafer. The upper and lower portions may be formed in one integral piece, or alternatively the two portions may be formed of separate pieces and then attached to each other via known techniques such as welding. Of particular advantage, this embodiment of the wafer holder provides the dual effect of (1) slowing the heating and cooling non uniformities in the edge of the wafer by the thermal mass positioned near the edge of the wafer, and (2) blocking at least a portion of the radiative heat transfer from the upper end of the chamber to the edge of the wafer.

Figure 17:
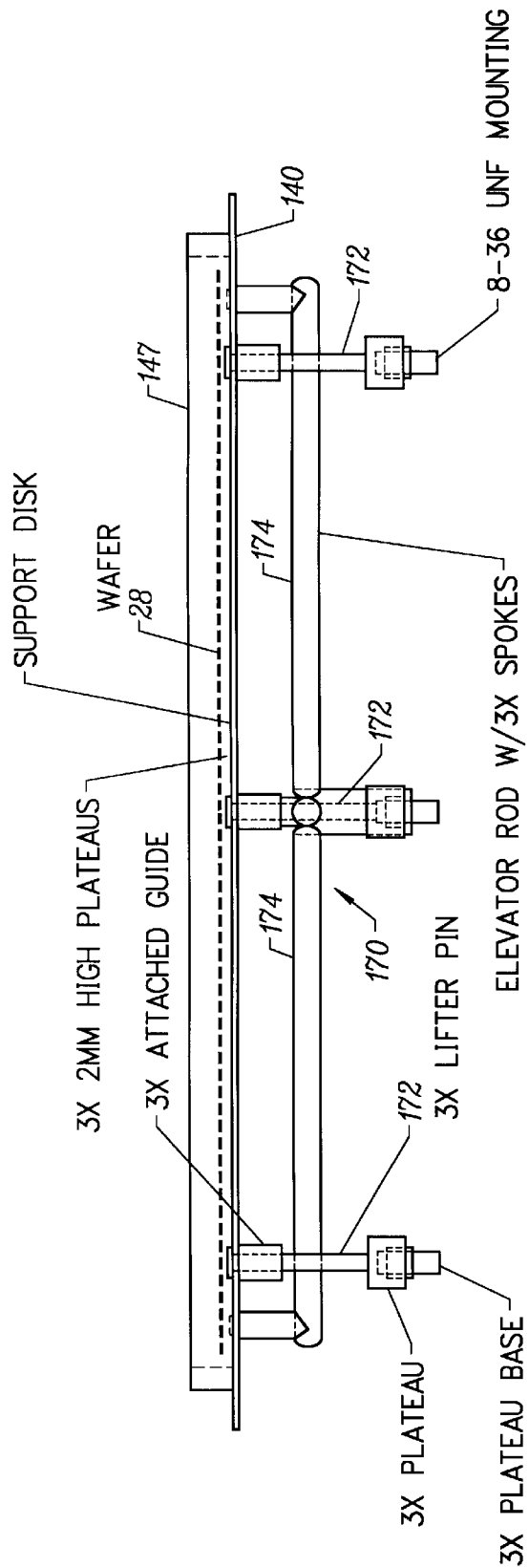
FIG. 17 is an cross sectional view showing a portion of the wafer holder and wafer lift assembly in accordance with one embodiment of the present invention.
Figure 18:
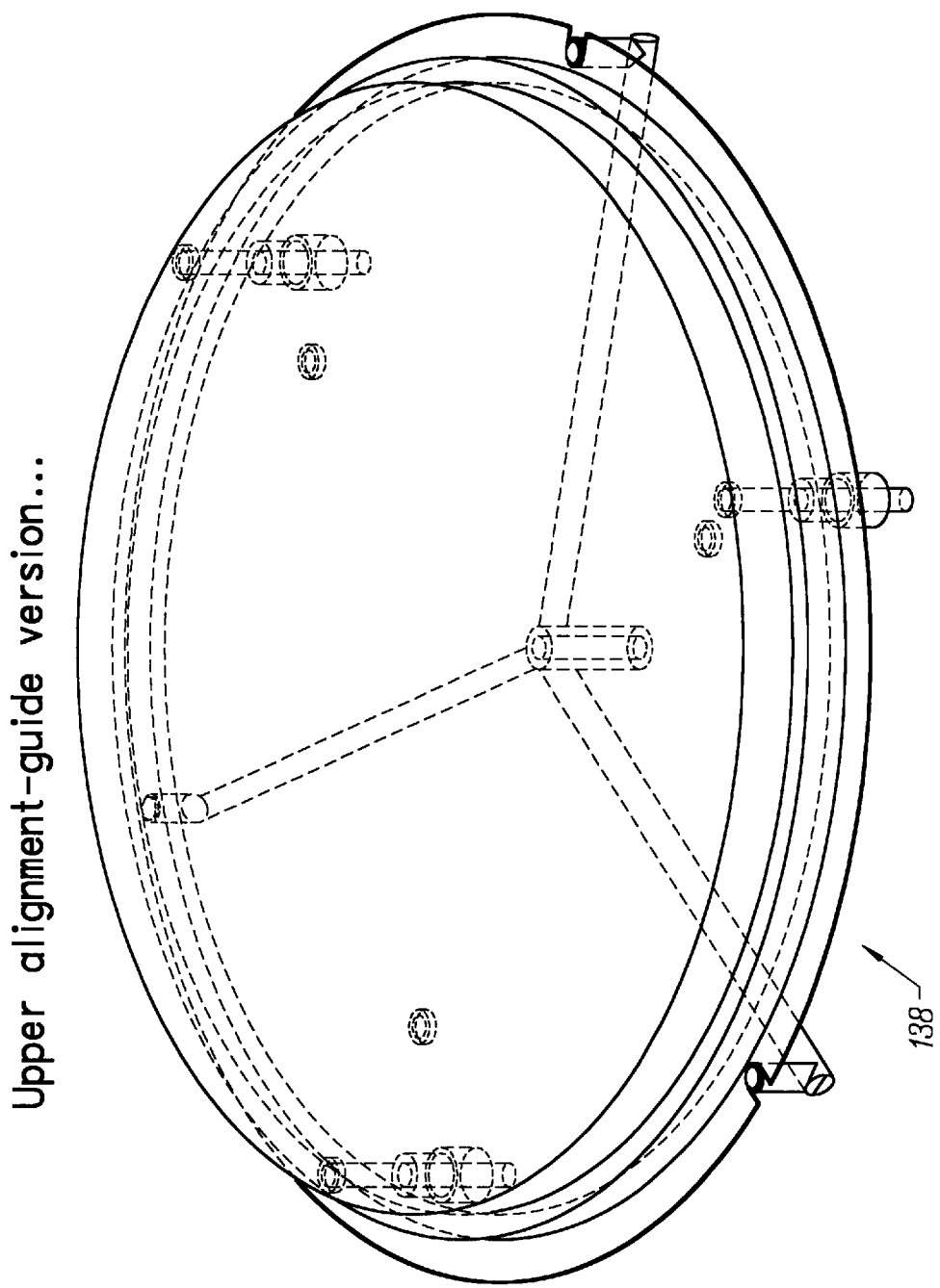
FIG. 18 is a perspective view showing the wafer holder in accordance with another embodiment of the present invention.

Another embodiment of the present invention is shown in FIGS. 17 and 18. In this embodiment the wafer holder includes a wafer lift assembly 170. The wafer lift assembly 170 generally includes a plurality of lifter pins 172 coupled via an elevator rod 174. Preferably, the elevator rod contains three spokes connected to three lifter pins 172. The lifter pins extend and retract through openings in the support member 140 to raise and lower the wafer 28. For example, to receive a wafer for processing, the lifter pins are extended, and the wafer 28, carried typically by and end effector (not shown) is positioned above the pins and then placed on the extended pins. In the extended position, the pins extend a distance above the height of the edge effect member.

To process the wafer, the lifter pins retract through the openings in the support member 140 thereby bringing the wafer to rest on the support member as illustrated in FIG. 17. After processing, the lifter pins again extend and lift the wafer above the edge effect member and the wafer is removed.

Figure 19:
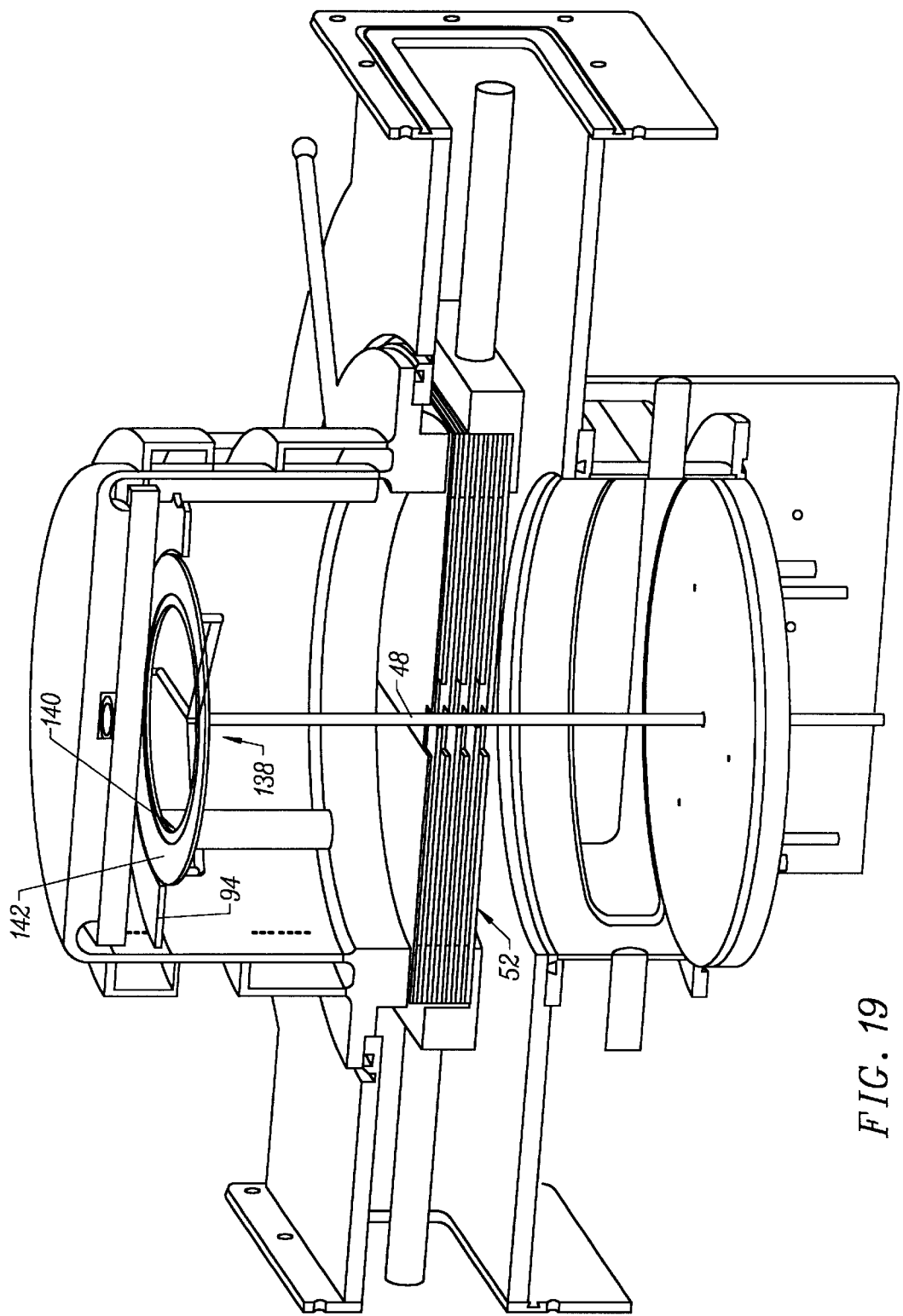
FIG. 19 is a cross sectional view showing the heat treating apparatus and wafer holder in accordance with one embodiment of the present invention.

It is to be understood that any variety of support member configurations may be used, and that any one of the different support members illustrated in the figures may be combined with the different edge effect member embodiments illustrated in the figures. FIG. 19 shows one embodiment of the wafer holder positioned within the heat treatment apparatus according to one embodiment of the present invention. The wafer holder 138 includes the wafer support member 140 and the edge effect member 142. The edge effect member 142 is adjacent and spaced apart from the flow containment member 94, with a gap formed between the outer diameter of the wafer holder 138 and the inner diameter of the flow containment member 94.

Figure 20:
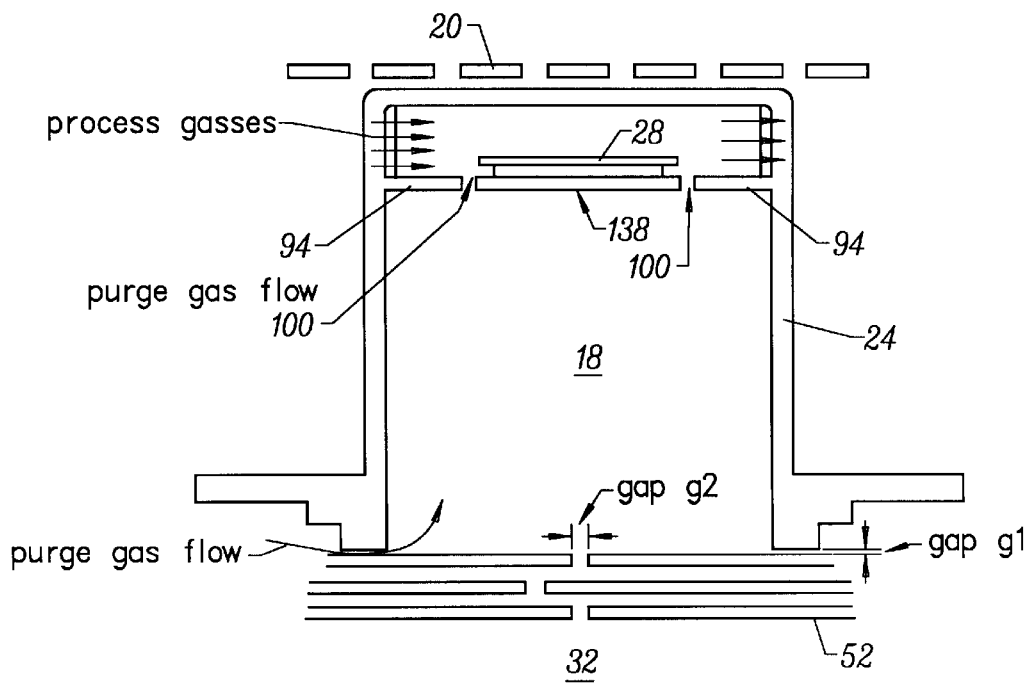
FIG. 20 is an partial cross sectional view of the heat treatment apparatus showing the flow and containment of gases within the apparatus.

In another aspect of the present invention, the heat treatment apparatus provides improved containment of the gases within the processing tube, and in particular within the heating chamber 18. Referring to FIG. 20, as the process gases are delivered to the surface of the wafer 28 by the fluid delivery system, it is desirable to contain these gases within the region surrounding the wafer and within the hot section (i.e. the heating chamber) of the heat treatment apparatus. Specifically, in addition to providing heat containment, the shutters 52 are employed to contain the process gases within the heating chamber 18. In one embodiment, this is achieved by providing a small gap "g1" in the processing tube between the bottom of the process chamber 18 and the top of the shutter 52 and then flowing a purge gas from the cooling chamber 32 into the heating chamber 18 through the gap g1. A pressure differential is maintained between the heating 18 and cooling 32 chambers, with the pressure in the cooling chamber 32 being greater than the pressure in the heating chamber. Thus, positive pressure is established below the shutter 52, in the cooling chamber or shutter housing volume, which causes the purge gas to flow into the heating chamber. A second gap g2 may be provided between the opposing shutters 52 but preferably it's length should be minimized. The gaps g1 and g2 are preferably small so that the purge gas flow rate required to provide containment is small, and g1 and g2 are preferably in the range of about 0.040 to 0.15 inches.

In another embodiment, containment is provided by primary and secondary containment. The secondary containment is the same as described in the immediately preceding paragraph, that is by providing the gap g1 between the bottom of the heating chamber and the top of the shutter and by maintaining positive pressure below the shutter. Primary containment of the process gases is achieved by providing a pressure differential across the flow containment member 94. In this embodiment, the pressure below the flow containment member 94 is greater than the pressure above the member 94 which causes the purge gas to flow through the gap 100 formed between the wafer 28 and the inner edge 98 of the flow containment member, and into the region above the flow containment member 94. This region is where the process gases are delivered to the wafer, and the containment scheme described promotes isolation and containment of the process gases within this region.

To minimize disruption to the process gases, it is preferred that the pressure differentials be small, such as around a few inches of water column. Further, it is preferred that the purge gases are inert and ultra pure to minimize impact on the process gases.

In yet another embodiment of the present invention, the heat treatment apparatus may employ an additional cooling station. The additional cooling station may be used to cool the wafer more rapidly, and/or to cool the wafer to a lower temperature (for example as low as room temperate at approximately 23° C.) prior to its removal from the apparatus. Preferably, the cooling station is positioned adjacent the cooling chamber 32, but is preferably thermally isolated from cooling chamber 32. Thermal isolation from cooling chamber 32 helps to isolate the cooling station from the effects of the heating chamber. The cooling station includes a cooling means for further cooling of the wafer. Any suitable cooling means may be used, such as one or more water cooled plates, thermoelectric chill plates, parallel water cooled plates, and the like. Also, corrective cooling, such as a shower of nitrogen may be used.

In another embodiment of the present invention, the heat treatment apparatus includes a preheat station. For some applications it is important to have a very uniform temperature profile for certain temperature windows. This is especially true when processing the silicon after implanting. Temperatures general must be very uniform above about 600° C. to prevent adverse effects. According, in one embodiment, a preheating or pre-conditioning chamber is provided. The preheating/pre-conditioning chamber can be used in two ways. First, the chamber can be used as a simple preheater when the wafer is heated to a stabilization temperature. This stabilization temperature would be below the temperature where thermal uniformity becomes critical. After achieving the stabilization temperature, the wafer is then inserted into the hotter portion of the apparatus, such as the heating chamber 18, and ramped up the desired temperature in a substantially uniform manner. This method helps to improve the within wafer thermal uniformity at higher temperatures which it is most critical.

Second, another method is to use the preheat/preconditioning chamber to create a desired temperature profile on the wafer to compensate for edge heating effects on the wafer. The system is configured to provide temperature distribution to the wafer during heating. The distribution of heating to the wafer can vary as much as 50° C. hotter at the center of the wafer than the edge of the wafer. Of particular advantage, the within wafer temperature variations are minimized in the temperature window of most interest, from about 600 to 1100° C.

Figure 21:
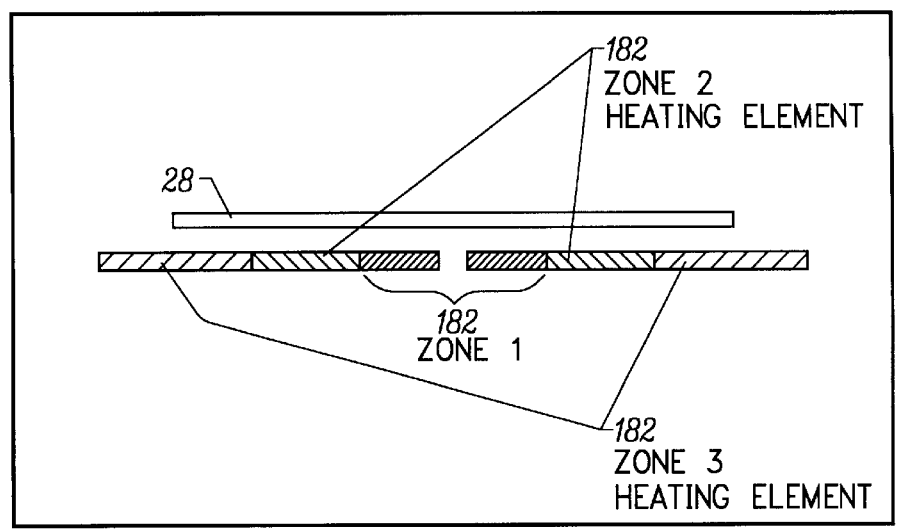
FIG. 21 is a cross sectional view of a heating zone for a preheat chamber in accordance with one embodiment of the present invention.

The preheat/pre-conditioning chamber 180 is shown in FIG. 21. The chamber 180 includes one or more heating zones 182 preferably positioned below the wafer and arranged axis-symmetrically. Each of the zones has independent temperature control, such that each zone can be selectively heated to a different temperature. The different temperature zones heat different portions of the wafer to different temperatures. Temperature feedback for each of the zones can be achieved by the use of thermocouples.

Figure 22:
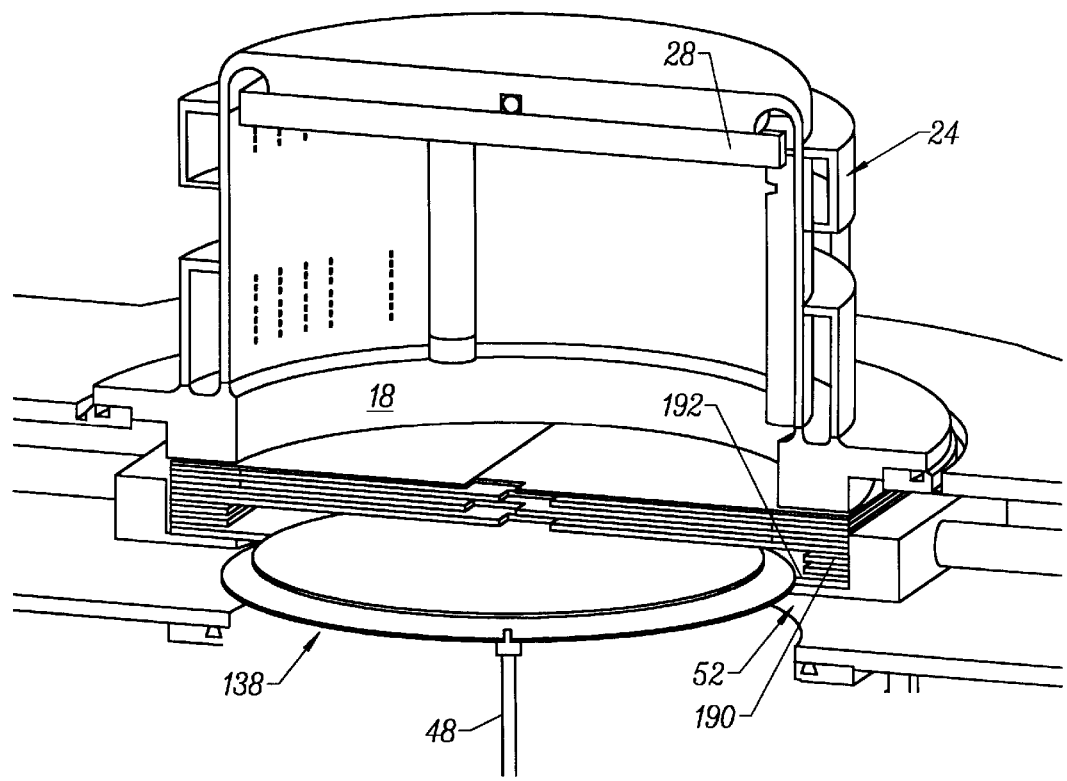
FIG. 22 is a perspective cross-sectional view of a portion of the heat treatment apparatus according to another embodiment of the present invention.
Figure 23:
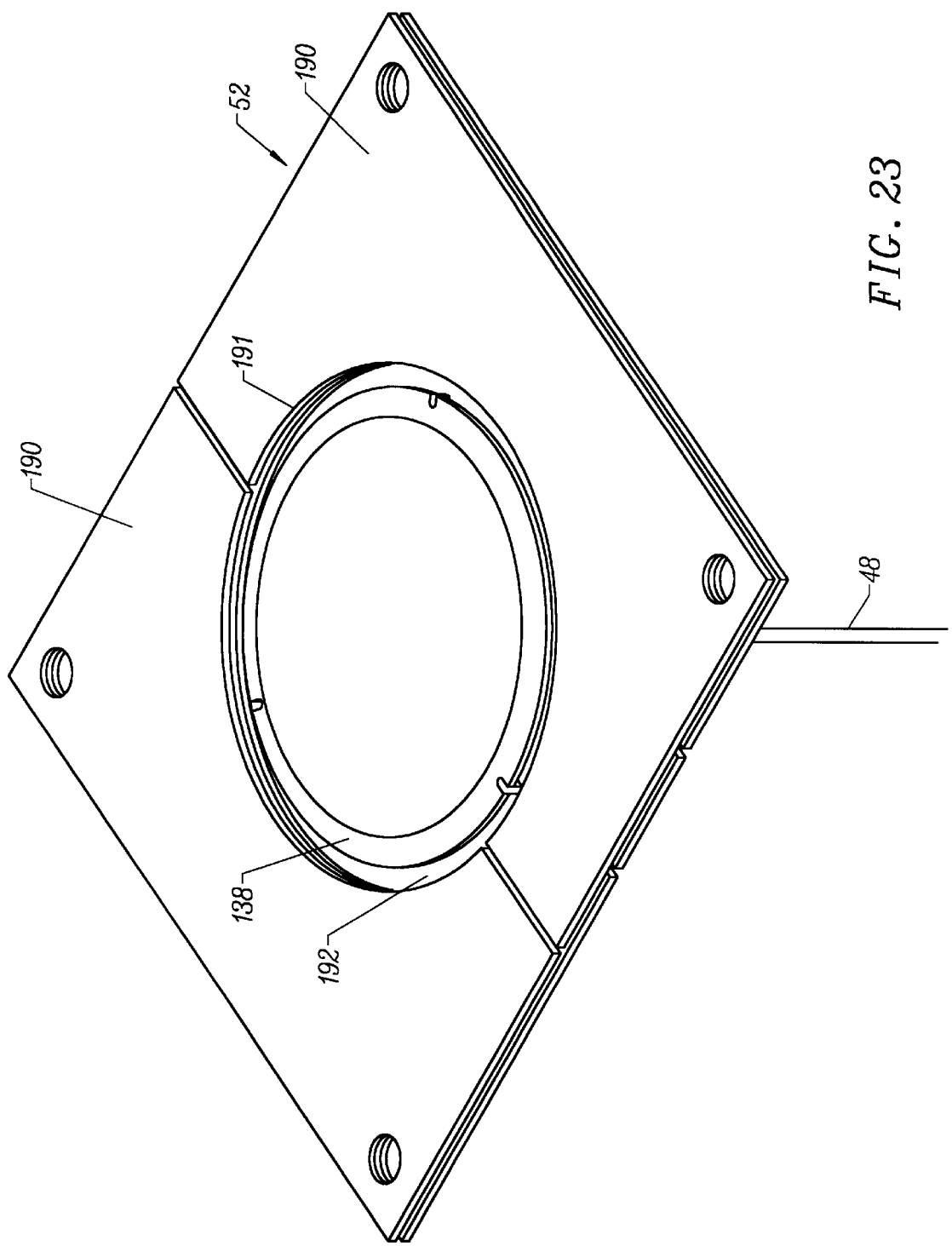
FIG. 23 is a cutaway perspective cross-sectional view of the shutter cavity portion of FIG. 22.

Another embodiment of the present invention is shown in FIGS. 22 and 23. For clarity only the heating chamber is shown and certain of the internal components are not shown. Of particular advantage, in this embodiment, the shutters include a shutter cavity 192 formed within a portion of the shutters. Specifically, as shown in more detail in FIG. 23 (the top shutters are removed for clarity) one or more of the internal shutters 190 include a large recess 191. The recess 191 is preferably a semi-circular shape such that when opposing shutters 190 are closed, the shutter cavity 192 is formed therein. The shutter cavity 192 is of a size and diameter suitable for receiving the wafer carrier 138. The shutter cavity allows for the wafer carrier to be positioned therein, and is suitable for preheating of the wafer prior to being positioned within the heating chamber 18 for processing.

This embodiment is particularly suitable for annealing processing. For example, during the anneal process, temperatures may reach about 900 to 1200° C., depending on the type of wafer being processed. The shutter cavity 192 provides an enclosed area where the wafer can be preheated prior to entering the heating chamber 18. This allows the center of the wafer to be heated prior to being exposed to the full annealing temperatures, which improves the within wafer uniformity at these higher temperatures.

Figure 24A:
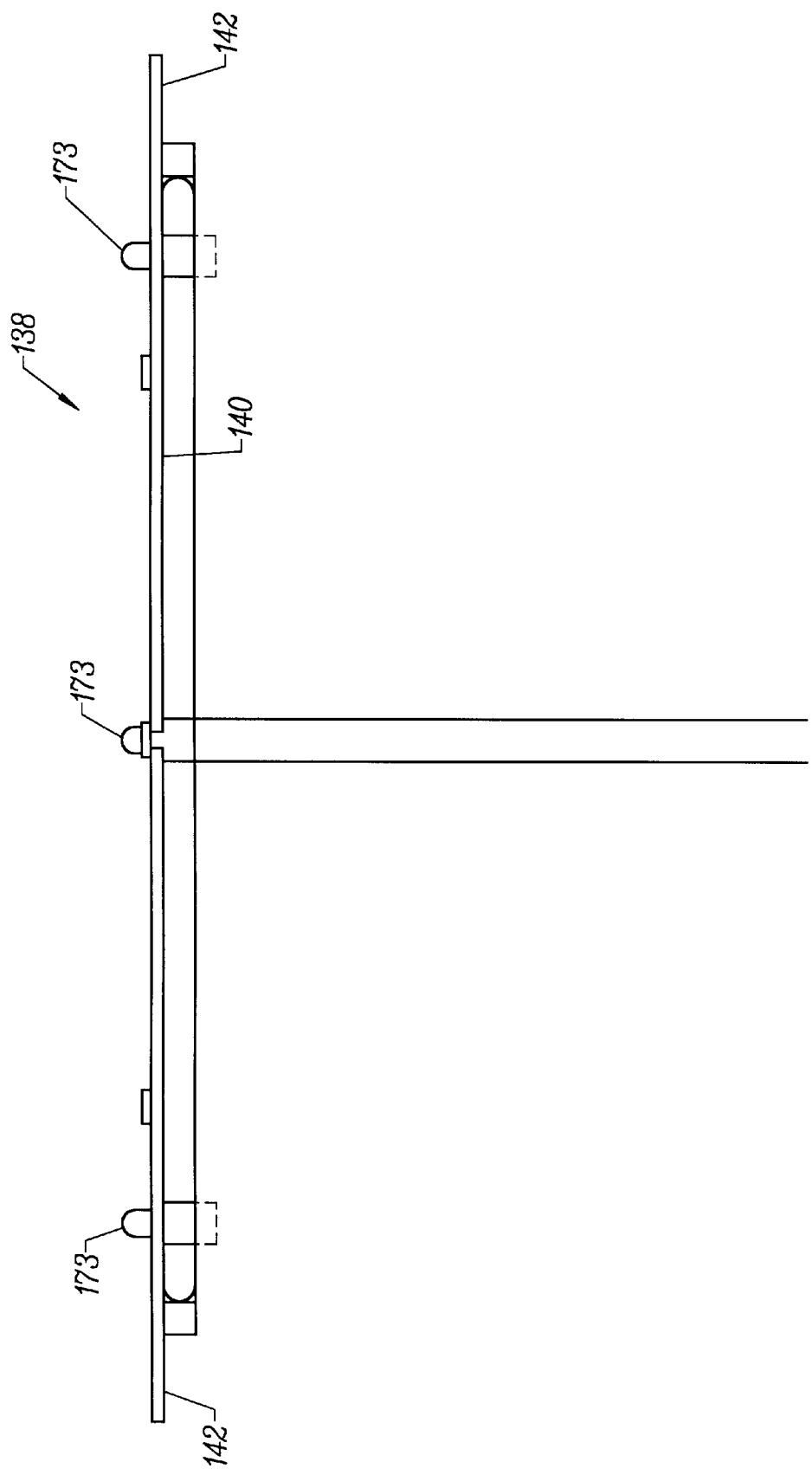

The recessed shutters 190 and the shutter cavity may be configured to accommodate any of the various wafer carrier embodiments described herein. Another embodiment of the wafer carrier is shown in FIGS. 24A–24C. In this embodiment, the edge effect member 142 is part of a flat plate which extends beyond the edge of the wafer. Also, a different pin 173 configuration may be used. Pins 173 are larger and have a rounded surface to engage the wafer, as compared to pins 172. The wafer carrier in this embodiment provides a narrower profile than some of the other embodiments, for placement within the shutter cavity. However, it is to be understood that any of the wafer carrier embodiments may be positioned within the shutter cavity 192.

While the present invention is disclosed by reference to the preferred embodiments and examples detailed above, it is to be understood that these examples are intended in an illustrative rather than limiting sense, as it is contemplated that modifications and combinations will readily occur to those skilled in the art, which modifications and combinations will be within the scope of the invention and the scope of the appended claims.

What is claimed is:

1. A heat treatment apparatus, comprising:
   a heating chamber having a heat source;
   a cooling chamber positioned adjacent to the heating chamber and including a cooling source;
   a wafer holder configured to move between the cooling chamber and the heating chamber through a passageway positioned between the heating source and the cooling source; and
   one or more shutters defining the size of the passageway and being movable between an open position where the wafer holder can pass through the passageway and an obstructing position which defines a passageway which is smaller than the passageway defined when the shutter is in the open position, wherein at least one of the one or more shutters includes two or more members positioned to define at least a portion of an air gap between adjacent members.

2. The apparatus of claim 1, wherein the heating source is a heating plate positioned adjacent to a plurality of heating elements, the heating plate configured to receive heat from the heating elements and re-radiate heat into the heating chamber.

3. The apparatus of claim 2, wherein a processing tube defines the heating chamber and the heating plate is positioned outside the processing tube.

4. The apparatus of claim 2, wherein the heating chamber is defined by a processing tube which includes the heating plate.

5. The apparatus of claim 4, wherein a path from the heating plate to the wafer holder is unobstructed.

6. The apparatus of claim 1, wherein a processing tube defines the heating chamber and an upper end of the processing tube includes a plurality of fluid ports configured to deliver a fluid into the heating chamber.

7. The apparatus of claim 6, wherein the fluid ports are evenly distributed across the closed upper end.

8. The apparatus of claim 6, wherein the fluid ports are positioned such that a fluid delivered from the fluid ports would be delivered onto a wafer held by the wafer holder from over the wafer.

9. The apparatus of claim 6, wherein a first plurality of the fluid ports are coupled with a first fluid conduit and a second plurality of fluid ports are coupled with a second fluid conduit.

10. The apparatus of claim 1, wherein the cooling source is positioned adjacent to a bottom of the cooling chamber.

11. The apparatus of claim 1, wherein the cooling source is positioned beneath the lowest position that the wafer holder can occupy within the cooling chamber.

12. The apparatus of claim 1, wherein the cooling source includes a cooling fluid conduit or delivering a cooling fluid into the cooling chamber.

13. The apparatus of claim 1, wherein the cooling source is a cooling plate having one or more conduits for transporting a cooling fluid through the cooling plate.

14. The apparatus of claim 1, wherein the cooling source is a cooling plate positioned adjacent to one or more conduits configured to carry cooling fluid.

15. The apparatus of claim 1, wherein the cooling source is a cooling plate including one or more apertures, each aperture configured to slidably receive a shaft which supports the wafer holder.

16. The apparatus of claim 1, wherein the cooling source is a cooling plate positioned approximately concentric with wafers held by the wafer holder.

17. The apparatus of claim 1, wherein the cooling source is a cooling plate with an upper surface having a surface area exceeding the surface area of a bottom surface of a typical wafer to be held by the wafer holder.

18. The apparatus of claim 1, wherein the wafer holder is configured to hold the wafer so the wafer can be positioned within proximity of the heating source.

19. The apparatus of claim 1, wherein no portion of the wafer holder extends above a wafer being held by the wafer holder.

20. The apparatus of claim 1, wherein the one or more shutters is configured to slide in a substantially horizontal plane.

21. The apparatus of claim 1, wherein the one or more shutters is constructed from a heat shielding material.

22. The apparatus of claim 1, wherein the one or more shutters are configured to occupy an obstructing position when the wafer holder is positioned within the heating chamber.

23. The apparatus of claim 1, wherein a shaft supports the wafer holder and at least one of the one or more shutters has a side with a recess, the recess having a shape which is complementary to a cross sectional contour of the shaft.

24. The apparatus of claim 23, wherein the one or more shutters is configured to move to an obstructing position where the shaft is accommodated within the at least one recess.

25. The apparatus of claim 1, wherein the two or more members are constructed from a quartz covered thermal insulator, or plain opaque quartz.

26. The apparatus of claim 1, wherein the one or more shutters includes two shutters positioned on opposing sides of the passageway, the two shutters being movable toward and away from one another.

27. The apparatus of claim 1, wherein at least of the one or more shutters can be slidably received within another of the one or more shutters.

28. The apparatus of claim 1, wherein a first shutter selected from the one of the one or more shutters can be slidably received within a second of the one or more shutters such that the first shutter and the second shutter define at least a portion of an air gap.

29. The apparatus of claim 1, wherein the one or more shutters can occupy an obstructing position which completely closes the passageway.

30. The apparatus of claim 1, further comprising:
one or more fluid inlet ports positioned to deliver a fluid into the heating chamber.

31. The apparatus of claim 30, wherein a member extends into the heating chamber from a side of the heating chamber at a height below a height of the fluid inlet port.

32. The apparatus of claim 30, wherein a member extends into the heating chamber from a side of the heating chamber at a height above a height of the fluid inlet port.

33. The apparatus of claim 1, wherein a member extends into the heating chamber from a side of the heating chamber and is coupled with a heating plate.

34. The apparatus of claim 33, wherein the member supports the heating plate.

35. The apparatus of claim 1, wherein a member extends into the heating chamber from a side of the chamber, the member having an edge with a shape which is complementary to the perimeter of a portion of wafer to be treated in the apparatus.

36. The apparatus of claim 35, wherein a length of the edge is larger than the portion of the perimeter to which the edge is complementary.

37. The apparatus of claim 31, further comprising a flow distribution chamber which distributes a flow of fluid from the one or more fluid inlet ports, the flow distribution chamber positioned such that fluid from the fluid inlet port enters the heating chamber through the flow distribution chamber.

38. The apparatus of claim 1, further comprising a flow distribution chamber for distributing the flow of fluid from the one or more fluid inlet ports, the flow distribution chamber positioned such that fluid from the fluid inlet port enters the heating chamber through the flow distribution chamber.

39. The apparatus of claim 1, further comprising;
a fluid exhaust port for withdrawing fluid from the heating chamber; and
a flow distribution chamber for distributing a flow of fluid from the heating chamber to the fluid exhaust port, the flow distribution chamber positioned such that fluid from the heating chamber enters the fluid exhaust port through the flow distribution chamber.

40. The apparatus of claim 38, wherein the flow distribution chamber includes a flow distribution member positioned between a wall of the heating chamber and a member extending into the heating chamber from a side of the heating chamber.

41. The apparatus of claim 38, wherein the flow distribution chamber includes a flow distribution member positioned between a first member extending into the heating chamber from a side of the chamber and a second member extending into the heating chamber from the side of the heating chamber.

42. The apparatus of claim 1, further comprising:
one or more fluid inlet ports positioned to deliver a fluid into the heating chamber; and
one or more fluid exhaust ports positioned to withdraw a fluid into the heating chamber, the one or more fluid exhaust ports positioned such that a fluid flowing from the one or more fluid inlet ports to the one or more fluid exhaust ports flows across the heating chamber.

43. A heat treatment apparatus, comprising:
a heating chamber having a heat source;
a cooling chamber positioned adjacent to the heating chamber and including a cooling source;
a wafer holder configured to move between the cooling chamber and the heating chamber through a passageway positioned between the heating source and the cooling source;
one or more shutters defining the size of the passageway and being changeable between an open position where the wafer holder can pass through the passageway and an obstructing position while the wafer holder is positioned within the heating and cooling chamber, the obstructing position defines a passageway which is smaller than the passageway defined when the shutter is in the open position;
one or more fluid inlet ports positioned to deliver a fluid into the heating chamber;
one or more fluid exhaust ports positioned to withdraw the fluid from the heating chamber;
a flow distribution chamber positioned such that the fluid from the fluid inlet ports is distributed to the heating chamber and the fluid from the heating chamber is distributed to the exhaust ports through the flow distribution chamber; and
one or more flow containment members extending into the heating chamber from a side of the heating chamber, the member having an edge with a shape which is complementary to a perimeter of a portion of a wafer supported in the wafer holder.

44. The heat treatment apparatus of claim 43 wherein, the cooling chamber is maintained at a pressure greater than a pressure in the heating chamber, and
a purge gas is flowed from the cooling chamber to the heating chamber to provide containment of process gases in the heating chamber.

45. The heat treatment apparatus of claim 43 further comprising:
a cooling station positioned adjacent the cooling chamber and thermally isolated from the cooling chamber.

46. The heat treatment apparatus of claim 43 further comprising:
a preheat/pre-conditioning station having one or more heating zones positioned below a wafer and in thermal relation to the wafer;
wherein each of the heating zones is coupled to an independent temperature control, such that each heating zone can be selectively heated to a different temperature.

* * * * *